United States Patent
Scott et al.

(10) Patent No.: US 7,480,610 B2
(45) Date of Patent: Jan. 20, 2009

(54) SOFTWARE STATE REPLAY

(75) Inventors: David C. Scott, Santa Clara, CA (US); Charles W. Selvidge, Wellesley, MA (US); Joshua D. Marantz, Brookline, MA (US); Frédéric Reblewski, Paris (FR)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 11/181,036

(22) Filed: Jul. 12, 2005

(65) Prior Publication Data

US 2006/0074622 A1 Apr. 6, 2006

Related U.S. Application Data

(60) Provisional application No. 60/587,757, filed on Jul. 12, 2004.

(51) Int. Cl.
*G06F 9/455* (2006.01)
(52) U.S. Cl. .............. 703/23; 703/14; 703/28; 703/18; 716/1; 716/7; 716/4; 716/5
(58) Field of Classification Search .......... 703/14, 703/23, 28, 18; 716/1, 7, 4, 5; 702/181, 702/127; 714/724; 713/400; 370/389
See application file for complete search history.

(56) References Cited

U.S. PATENT DOCUMENTS 5,649,176 A 7/1997 Selvidge et al.
5,680,583 A 10/1997 Kuijsten
5,754,827 A * 5/1998 Barbier et al. ............... 703/14
5,790,832 A * 8/1998 Barbier et al. ............... 703/28
5,999,725 A * 12/1999 Barbier et al. ............... 703/28
6,009,531 A * 12/1999 Selvidge et al. ............ 713/400
6,061,511 A * 5/2000 Marantz et al. .............. 703/28
6,265,894 B1 * 7/2001 Reblewski et al. .......... 326/39
6,817,001 B1 * 11/2004 Kudlugi et al. ............. 716/6
7,035,787 B2 * 4/2006 Reblewski .................. 703/28
2004/0044510 A1 * 3/2004 Zolotov et al. .............. 703/14
2004/0078187 A1 * 4/2004 Reblewski .................. 703/28
2004/0093541 A1 * 5/2004 Jain et al. ................... 714/724

(Continued)

OTHER PUBLICATIONS

Kudlugi et al., "Static Scheduling of Multidomain Circuits for Fast Functional Verification" Computer-Aided Design of Integrated Circuits and Systems. Nov. 2002, vol. 21, Issue 11, pp. 1253-1268.*

(Continued)

*Primary Examiner*—Kandasamy Thangavelu
(74) *Attorney, Agent, or Firm*—Banner & Witcoff, Ltd.

(57) ABSTRACT

A tool for emulation systems that obtains the state values for only discrete partitions of a circuit design. When a partition is being emulated, the emulation system obtains the input values for the specified partition at each clock cycle and the state values for the specified partition at intervals. Using the state and input values with a software model of the specified circuit design partition, the tool calculates the state values for the partition at every clock cycle. The software model may correspond to the partitioning information used to implement the circuit design across multiple configurable logic element devices, such as FPGAs. Thus, each software model may correspond to the portion of a circuit design emulated on a discrete FPGA integrated circuit.

22 Claims, 24 Drawing Sheets

U.S. PATENT DOCUMENTS

| | | | |
|---|---|---|---|
| 2004/0093571 A1* | 5/2004 | Jain et al. | 716/5 |
| 2004/0216063 A1* | 10/2004 | Dickey et al. | 716/7 |
| 2004/0221249 A1* | 11/2004 | Lahner et al. | 716/4 |
| 2004/0243376 A1* | 12/2004 | Karunaratne | 703/18 |
| 2004/0267489 A1* | 12/2004 | Reblewski et al. | 702/127 |
| 2005/0068949 A1* | 3/2005 | Diehl et al. | 370/389 |
| 2005/0228616 A1* | 10/2005 | Huang et al. | 702/181 |
| 2006/0117274 A1* | 6/2006 | Tseng et al. | 716/1 |

OTHER PUBLICATIONS

Kudlugi, M. et al. "Static Scheduling of Multiple Asynchronous Domains for Function Verification." Proc. Design Automation Conf. (DAC 2001). Jun. 18-22, 2001. pp. 647-652.*

Selvidge et al. "TIERS: Topology Independent Pipelined Routing and Scheduling for VirtualWire™ Compilation." Proc. of the 3rd Int'l ACM Symp. on FPGAs. 1995. pp. 25-31.*

Kudlugi et al. "Static Scheduling of Multi-Domain Memories for Functional Verification." IEEE/ACM Int'l Conf. on CAD. 2001. pp. 2-9.*

Kudlugi et al. "A Transaction-Based Unified Simulation/Emulation Architecture for Functional Verification." Proc. Design Automation Conf. 2001, pp. 623-628.*

Foltin, M. et al. "Efficient Stimulus Independent Timing Abstraction Model Based on a New Concept of Circuit Block Transparency." Proc. 39th Design Automation Conference (DAC). 2002. pp. 158-163.*

Singla et al., "Bipartitioning for Hybrid FPGA-software simulation", IEEE 1995.*

Tessier et al., "Incrermental Compilation for parallel logic verification systems", IEEE 2002.*

Kutler et al., "Architecture driven partitioning", IEEE 2001.*

Terrill, R., "50,000 gate ASIC prototyping PLD using four Flex 8000 devices and a programmable interconnect", IEEE 1994.*

* cited by examiner

SOFTWARE STATE REPLAY

RELATED APPLICATIONS

This application is a continuation-in-part application of U.S. Provisional Patent Application No. 60/587,757, entitled "Software State Replay," filed on Jul. 12, 2004, and naming David C. Scott et al. as inventors, which application is incorporated entirely herein by reference.

FIELD OF THE INVENTION

The invention relates to the field of emulation. More specifically, various embodiments of the invention relate to determining state values of reconfigurable logic elements emulating a portion of a circuit design.

BACKGROUND OF THE INVENTION

Microcircuit devices are used in a variety of products, from automobiles to microwaves to personal computers. Designing and fabricating microcircuit devices involves many steps; which has become known as a 'design flow,' the particular steps of which are highly dependent on the type of microcircuit, the complexity, the design team, and the microcircuit fabricator or foundry. Several steps are common to all design flows: first a design specification is modeled logically, typically in a hardware design language (HDL). Software and hardware "tools" verify the design at various stages of the design flow by running software simulators and/or hardware emulators, and errors are corrected.

More particularly, after the logical design is deemed satisfactory, it is converted into physical design data by synthesis software. The physical design data may represent, for example, the pattern that will be written onto a mask used to fabricate the desired microcircuit device in a photolithographic process at a foundry. It is very important that the physical design information accurately embody the design specification and logical design for proper operation of the device. Further, because the physical design data is employed to create masks used at a foundry, the data must conform to foundry requirements. Each foundry specifies its own physical design parameters for compliance with their process, equipment, and techniques.

First generation emulation systems were formed using general purpose reconfigurable electronic structures formed in an integrated circuit (IC). These reconfigurable electronic structures might include, for example, reconfigurable logic elements, such as general purpose field programmable gate arrays (FPGAs), and reconfigurable interconnects, such as crossbars. To emulate a circuit design on this type of emulation system, the circuit design would be "realized" by first compiling a formal description of the circuit design (expressed, for example, in a hardware description language such as Verilog). The circuit design then would be partitioned into subsets of related components (also referred to as netlists). The various netlists next would be mapped to the logic elements of the field programmable gate arrays of the emulation system, while the reconfigurable interconnects would be configured to interconnect the logic elements. The partitioning and mapping operations typically would be performed on workstations that were part of (or complementary to) the emulation system. Finally, the resultant configuration information (that is, the information to configure the reconfigurable logic elements and/or interconnects) would be downloaded to the logic boards hosting the integrated circuits with the reconfigurable electronic structures, and then to the reconfigurable structures themselves. With advances in integrated circuit and emulation technology, more recent model emulation systems may employ FPGAs specifically designed for emulation purposes. These special FPGAs typically will include a substantial number of on-chip reconfigurable logic elements, interconnects, memory, and debugging resources.

During the emulation process, test stimuli normally are generated either by the workstation or by a service board of the emulation system under the control of the workstation. The test stimuli is then transferred to the various logic boards as input into the reconfigurable logic integrated circuits for application to the various netlists of the circuit design being emulated. To emulate the operation of the circuit design, emulation signals often need to be transferred from one reconfigurable logic integrated circuit to another. At appropriate points in time, the state data of various circuit elements and/or various signals (sometimes referred to as "traces") of interest for the circuit design are read out of the appropriate reconfigurable logic integrated circuits and then transferred to the companion workstation for analysis.

Some conventional emulation systems obtain the state values of a circuit design for each clock cycle of the emulation process. Depending upon the number of state values being sampled from the emulated circuit, however, the obtained data might be too much information for the emulation system to process on a timely or useful basis. Accordingly, some emulation systems will only capture the state values at intervals, rather than at every clock cycle. The emulation system will then calculate the unsampled state values for every cycle, based upon the sampled state values and the combinational logic embodied by the circuit design.

This interval sampling technique provides some advantages over physically obtaining every state value at each emulated clock cycle. Depending upon the size of the circuit design, however, even this technique often is still too slow and processing intensive to be useful for analyzing the operation of the emulated circuit. Some emulation systems attempt to address this problem by using one or more alternate processing resources to assist in calculating the unsampled state values. For example, if the emulation system is being used in conjunction with a software-implemented simulation system, then some emulation systems will use the software simulator to calculate the unsampled state values. Even with the use of alternate processing resources, however, many circuit designs are still too large and complex for their state element values to be practically calculated at each emulated clock cycle.

SUMMARY OF THE INVENTION

Aspects of the present invention are directed to a tool for emulation systems that determine the state values for only discrete partitions of a circuit design. For example, some implementations of the invention employ a software model of one or more partitions of a circuit design. When a partition is being emulated, the tool obtains the input values for the partition at each clock cycle, and the state values for the partition at intervals. Using the state and input values with the software model of the circuit design partition, the tool can then calculate (or "replay") the state values for the partition at every clock cycle. Because the state values are determined for only discrete partitions of the entire circuit design, however, the state values can be quickly calculated for analysis.

With various examples of the invention, these software models will correspond to the partitioning information used to implement the circuit design across multiple configurable logic element devices, such as FPGAs. Thus, each software model may correspond to the portion of a circuit design emulated on a discrete FPGA integrated circuit. According to some aspects of the invention, the software state replay tool 301 may calculate the state values of two or more circuit design partitions in parallel. Because each partition software model employs only local input and state values, this type of parallel processing allows a user to efficiently analyze only desired state information across a circuit design. The use does not need to obtain or determine all of the state values for the entire circuit design.

As will be discussed in more detail below, some implementations of the invention may obtain state values at varying sampling intervals. Also, some implementations of the invention may alternately or additionally sample changes in one or more state values rather than the actual values themselves.

These and additional aspects of the invention will be further understood from the following detailed disclosure of illustrative embodiments.

BRIEF DESCRIPTION OF THE DRAWINGS

The present invention will be described by way of illustrative embodiments shown in the accompanying drawings in which like references denote similar elements, and in which.

DETAILED DESCRIPTION OF ILLUSTRATIVE EMBODIMENTS

Overview of an Illustrative Emulation System

Figure 1:
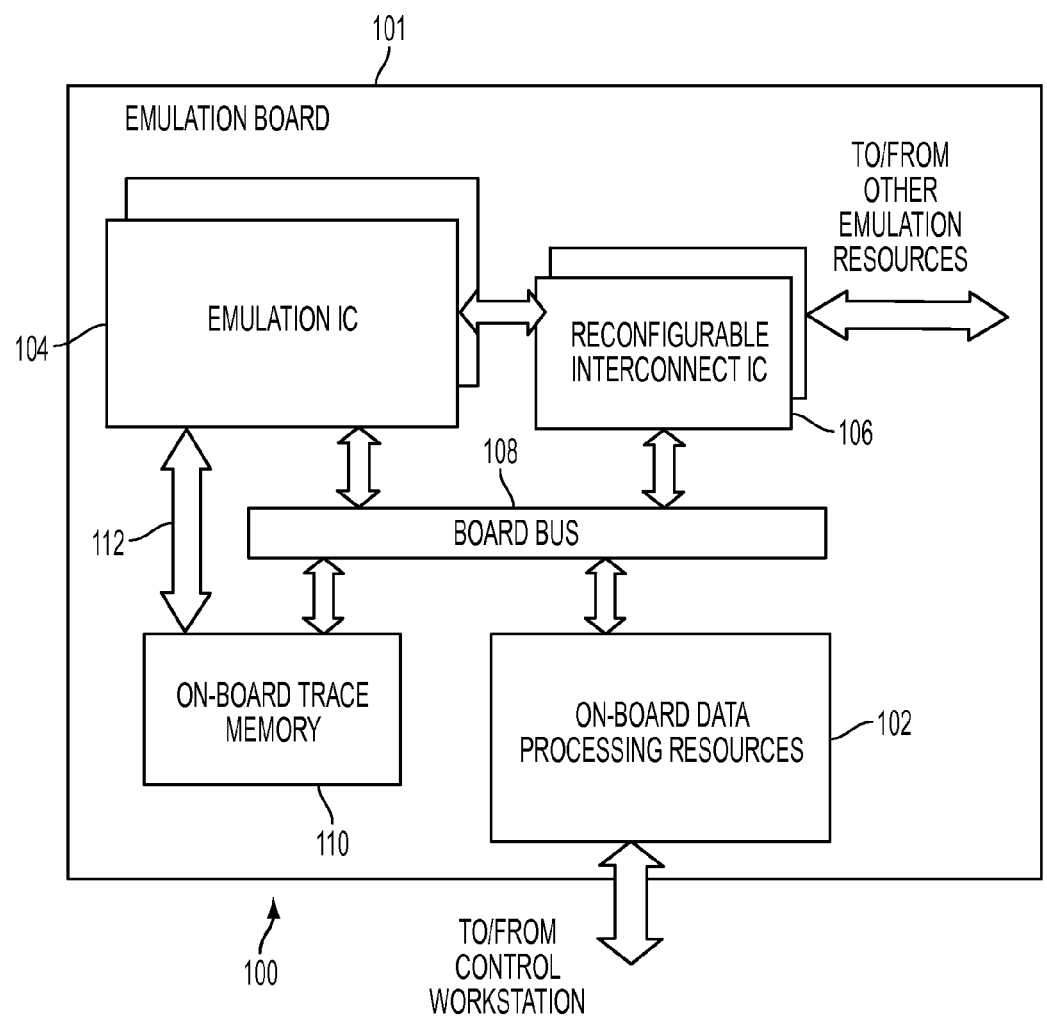
FIG. 1 illustrates an example of an emulation system that may be employed according to various implementations of the invention.

FIG. 1 shows an illustrative emulation system 100 or "emulator." As seen in this figure, the emulation system may include a plurality of emulation boards 101. Each emulation board 101 includes data processing resources 102, emulation integrated circuits (ICs) 104, reconfigurable interconnect circuits 106, a bus 108, and trace memory 110. In the illustrated system, the reconfigurable interconnect circuits 106 are shown as separate from the emulation integrated circuits (ICs) 104, but with other implementations of the invention reconfigurable interconnect circuits 106 may be incorporated into the emulation integrated circuits (ICs) 104.

In the illustrated example, the on-board data processing resources 102, the on-board emulation integrated circuits (ICs) 104, the on-board reconfigurable interconnect circuits 106, and the on-board trace memory 110 are communicatively coupled to each other through the on-board bus 108 as shown. Additionally, the on-board emulation circuits 104 are directly coupled to the on-board trace memory 110. As used herein, the term "on-board" refers to system components that are physically located on an emulation board.

Each emulation circuit 104 may include various resources, such as reconfigurable logic elements, reconfigurable interconnects, emulation memories, context or state elements and the like to facilitate emulation of netlists making up a circuit design. Reconfigurable interconnect circuits 106 couple the emulation resources of the various emulation circuits 104 of the emulation logic board to other emulation logic boards 100 to form an emulation system.

In the illustrated example, the on-board bus 108 and trace memory 110 perform their conventional functions of facilitating on-board data and command transfers. These components also collect state information for the various emulation signals from the assigned partitions or netlists of the circuit design being emulated. On-board bus 108 and on-board trace memory 110 are intended to represent the broad range of elements that can be employed to perform these and other conventional functions, as known in the art. The data processing resources 102 then may be employed to locally and distributively perform various conventional emulation functions on behalf of and at the direction of the control resources.

As known to those of ordinary skill in the art, a part of a circuit design is assigned to each emulation circuit 104. Reconfigurable logic elements, context/state elements and emulation memory of the emulation circuit 104 then are used to emulate the circuit elements in the netlists of the assigned partition of the circuit design. In particular, the reconfigurable logic elements are used to emulate the combinatorial logic of the netlists, while the context/state elements are used to emulate the state elements of the netlists, such as flip-flops and the like. The emulation memory is used to emulate storage elements of the netlists, and reconfigurable interconnects are used to reconfigurably couple the logic elements, the memory, and the context/state elements 210.

Various examples of the invention will employ EDA software in an emulation control system to operate and control the emulation system 100. The emulation control system may perform any desired functions relating to the emulation system 100 including, for example, partitioning the netlists of a circuit design and reconfiguring the reconfigurable logic elements to synthesize structures in the circuit design. Some particular implementations of the invention discussed in more detail below may use, for example, the VSYN software program to synthesize structures of the circuit design on the emulation circuits 104. Other implementations of the invention, however, may use any desired software or combination of software to perform these functions.

Programmable Computing Device

Figure 2:
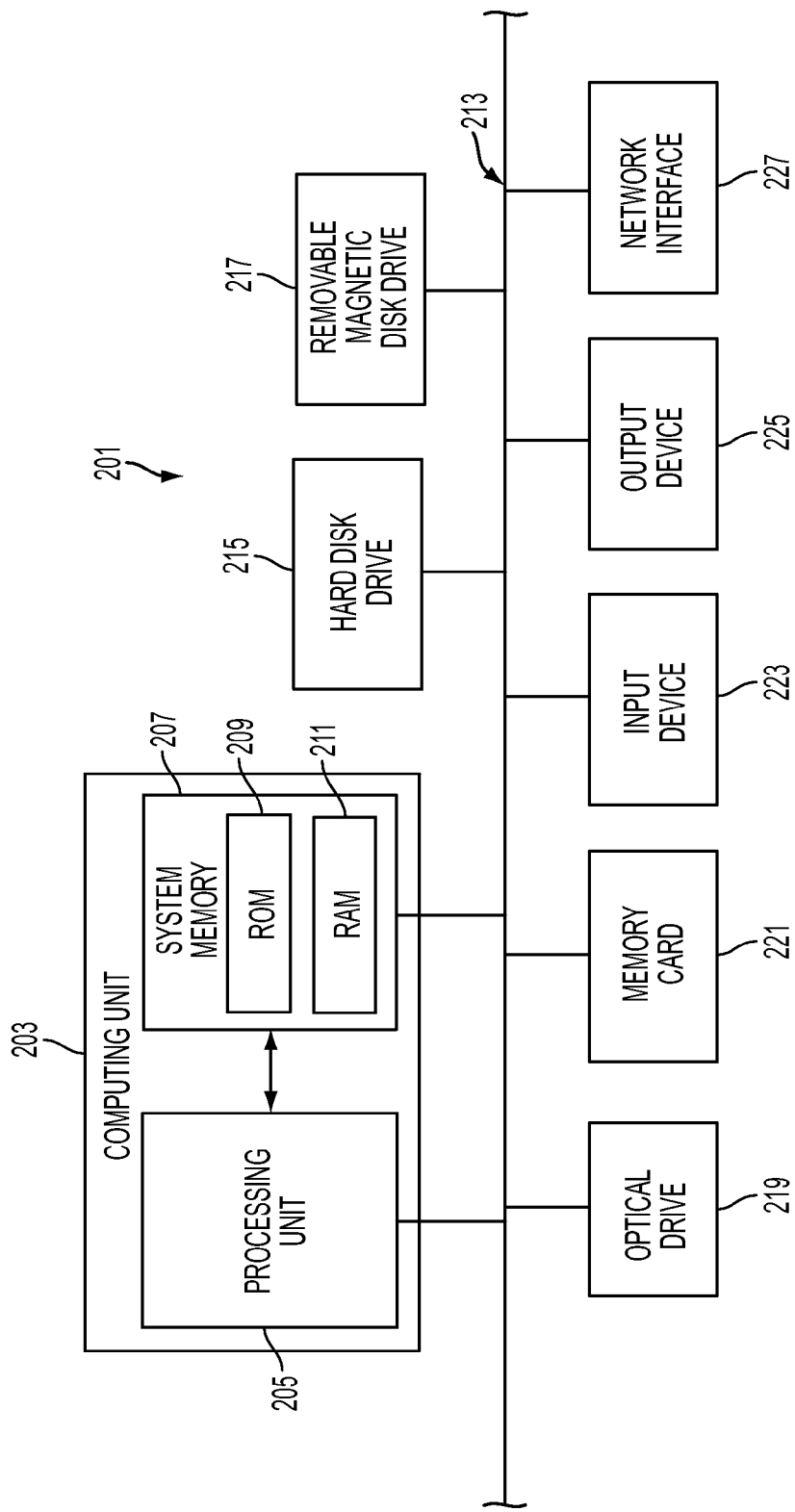
FIG. 2 illustrates an example of a programmable computing device that may be employed according to various examples of the invention.

As will be apparent from the following discussion, one or more components of a software state replay tool 301 according to various embodiments of the invention may be implemented by executing software instructions on a programmable computer. Still further, the software state replay tool 301 according to various embodiments of the invention will employ computing resources to calculate state value for a circuit design partition based upon the sampled state values, the partition input values, and the partition circuit model. Both the tool 301 and its computing resources may be implemented using one or more computing devices, such as programmable computers. An illustrative example of a computing device 201 that may be used to implement various embodiments of the invention therefore is illustrated in FIG. 2. As seen in this figure, the computing device 201 has a computing unit 203. The computing unit 203 typically includes a processing unit 205 and a system memory 207. The processing unit 205 may be any type of processing device for executing software instructions, but will conventionally be a microprocessor device. The system memory 207 may include both a read-only memory (ROM) 209 and a random access memory (RAM) 211. As will be appreciated by those of ordinary skill in the art, both the read-only memory (ROM) 209 and the random access memory (RAM) 211 may store software instructions for execution by the processing unit 205.

The processing unit 205 and the system memory 207 are connected, either directly or indirectly, through a bus 213 or alternate communication structure, to one or more peripheral devices. For example, the processing unit 205 or the system memory 207 may be directly or indirectly connected to one or more additional memory storage devices, such as a hard disk drive 215, a removable magnetic disk drive 217, an optical disk drive 219, or a flash memory card 221. The processing unit 205 and the system memory 207 also may be directly or indirectly connected to one or more input devices 223 and one or more output devices 225. The input devices 223 may include, for example, a keyboard, a pointing device (such as a mouse, touchpad, stylus, trackball, or joystick), a scanner, a camera, and a microphone. The output devices 225 may include, for example, a monitor display, a printer and speakers.

With some implementations, the computing unit 203 may be directly or indirectly connected to one or more network interfaces 227 for communicating with a network. The network interface 227 translates data and control signals from the computing unit 203 into network messages according to one or more communication protocols, such as the transmission control protocol (TCP), the user datagram protocol (UDP), and the Internet protocol (IP). These and other conventional communication protocols are well known in the art, and thus will not be discussed here in more detail. An interface 227 may employ any suitable connection agent (or combination of agents) for connecting to a network, including, for example, a wireless transceiver, a modem, or an Ethernet connection.

It should be appreciated that one or more of these peripheral devices may be housed with the computing unit 203 and bus 213. Alternately or additionally, one or more of these peripheral devices may be housed separately from the computing unit 203 and bus 213, and then connected (either directly or indirectly) to the bus 213. Also, it should be appreciated that both computers and computing appliances may include any of the components illustrated in FIG. 2, may include only a subset of the components illustrated in FIG. 2, or may include an alternate combination of components, including some components that are not shown in FIG. 2.

Software State Replay Tool Overview

As noted above, the software state replay (SSR) tool 301 according to various examples of the invention produces a database of all state values for an FPGA over a time window specified by a user. For example, the time window may be defined by specified trigger events or selected during an on-line debug process. The produced state values are computed from a sample of state values obtained from the FPGA, in conjunction with the inputs to the FPGA and clock traces. By applying this data to execute a software application that models the operation of the circuit partition emulated in the FPGA, the software state replay tool 301 can faithfully simulate in software the cycle-by-cycle net and state values produced by the FPGA itself. The state values produced by the software state replay tool 301 then may be used by, for example, a reconstruction engine to display the state values as a waveform.

Accordingly, the software state replay tool 301 produces a software state replay model that describes the operation of the circuit design partition emulated by the emulator. With various embodiments of the invention, the software state replay tool 301 may include a "kernel" portion that is linked with a model portion produced by the emulator control software (e.g., the emulator compile software, such as VSYN) to produce the software state replay tool 301 for each FPGA making up the emulated circuit design.

Figure 3:
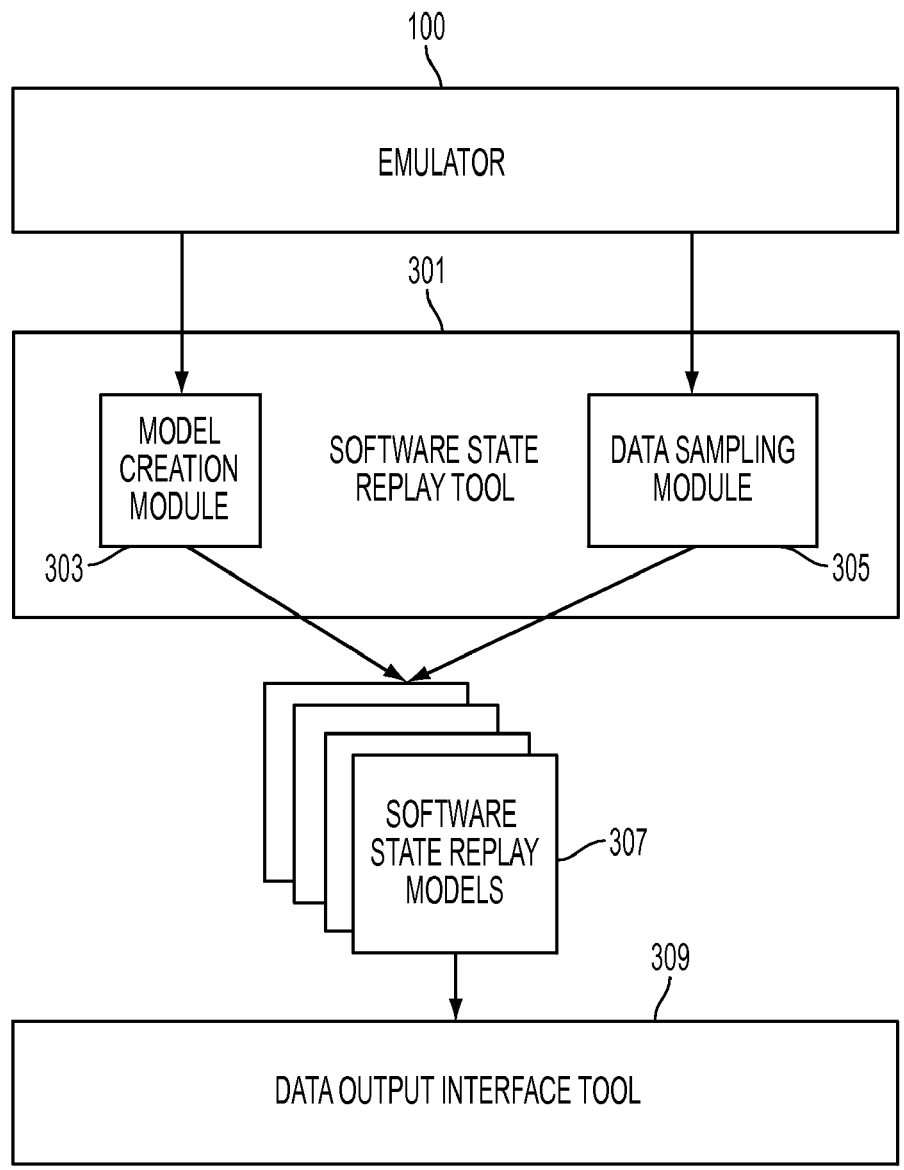
FIG. 3 illustrates a software state replay tool that may be implemented according to various examples of the invention.

FIG. 3 illustrates an example of a software state replay tool 301 301 according to various examples of the invention. As seen in this figure, the tool 301 301 includes a model creation module 303 and a data sampling module 305. As will be discussed in greater detail below, the model creation module 303 employs netlist information from the emulator 101 to create one or more software state replay models 307. As previously noted, each software state replay model 307 is a model of a partition of a circuit design. For example, each software state replay model 307 may correspond to the portion of a circuit being emulated on a single reconfigurable logic element device, such as a FPGA. The data sampling module 305 then provides an interface to supply input data from the emulator to each of the software state replay models 307. Both the model creation module 303 and the data sampling module 305 may be implemented, for example, by executing software instructions on programmable computing device such as the device 201 discussed in detail above.

The state values calculated by executing the software state replay models 307 with the data supplied by the data sampling module 305 is provided to a data output interface tool 301 307. The data output interface tool 301 307 may be, for example, a data reconstruction engine of the type described in U.S. Pat. No. 6,061,511 to Marantz et al., entitled "Reconstruction Engine For A Hardware Circuit Emulator," which patent is incorporated entirely herein by reference.

As will be appreciated, a software state replay tool 301 according to different aspects of the invention will additionally have various interfaces, which may be independent from or incorporated into the model creation module 303 or the data sampling module 305. For example, some implementations of the software state replay tool 301 will have input and output interfaces for a user.

Thus, with various embodiments of the invention, the software state replay tool 301 will have an input interface that a user may employ to distribute the software state replay models to one or more computing resources to calculate the state values. The software state replay will also typically have an output interface in the form of a log file indicating what was computed by the computing resource, when and where.

Still further, the software state replay tool 301 typically will have one or more system interfaces for interfacing with components of the emulation system or other related systems. For example, with some implementations of the software state replay tool 301, the tool 301 will interface with the emulation control system to employ the in-memory netlist database to determine design connectivity and attributes determined by the synthesis functionality of the emulation control system (e.g., VSYN). As noted above, the software state replay tool 301 can then use this information to create a software model 307 of the partition of the circuit design emulated by each FPGA.

The software state replay tool 301 may also interface with the emulation control system to employ the inter-FPGA timing database that specifies the timing, in virtual emulation clock cycles (referred to herein as "vcycles"), of all the interconnect paths between the FPGAs. As will be appreciated by those of ordinary skill in the art, this inter-FPGA timing database typically will be created by input from the place-and-route (PAR) functionality of the emulation control system, which determines how the circuit design will be partitioned and allocated among the FPGAs for emulation. The inter-FPGA timing database also is created from input from the scheduler functionality of the emulation control system, which determines inter-FPGA path lengths (in terms of vcycles) when the partitions of the circuit design are allocated among FPGAs. Still further, the software state replay tool 301 may also interface with the emulation control system to employ the intra-FPGA timing database that specifies the timing in vcycles of all the interconnect paths that lie entirely within an FPGA. This database also is created from input from the scheduler functionality of the emulation control system.

Still further, as described above, the software state replay tool 301 receives a state snapshot and input trace stream as input for each FPGA being analyzed. The state snapshot, provided by the emulator 100, are the state values obtained for the FPGA at intervals over a specified time period. The input trace stream, also provided by the emulator 100, includes clock input timestamps for each vcycle of the clock for the FPGA, and the complete set of input values to the FPGA associated with each clock edge. With various examples of the invention, the software state replay tool 301 will then provide a streaming output of all state values for all cycles within the time period for each FPGA. Some implementations of the software state replay tool 301 may additionally provide the original input and memory output traces for each FPGA, as desired. With some embodiments of the software state replay tool 301, the tool 301 will provide this output stream on demand, without persistently storing the data. Other examples of the invention, however, may alternately store the output stream in a waveform file for future analysis. This waveform file may be created in any desired file format, such as the "VRC" file format.

Software State Replay Models

As previously discussed, the software state replay tool 301 employs a software model of a circuit design partition (e.g., the portion of a circuit design that is implemented on a single FPGA) in order to calculate state values for the circuit design partition at each cycle. With various implementations of the invention, the cycle simulation algorithm employed by the software state replay model relies on 32-bit CPU logical operators (e.g., bitwise logical OR, AND, XOR, and Negate operation) to compute 32 bits in parallel. Each bit of a 32-bit word represents a state value at a different point in time.

For example, a single 32-bit word could represent a net value (i.e., the state value of a particular net) at points in time separated by 512 cycles, as follows:

(0 . 512 . 1024 . . . 31*512)

Re-computing this net value with a 32-bit logical operation based upon the software state replay model of the partition in which the net is located then will result in a computation of values at the next point in time for each bit:

(1 . 513 . 1025 . . . 31*512+1)

Thus, 512 iterations of this type of computation will calculate all of the state values of the net for 16,384 (i.e., 32*512) points in time.

Advantageously, a $513^{th}$ iteration will offer a confirmation check for the computation, since the 513th iteration of calculations will provide time points:

(512 . 1024 . 1536 . . . 31*512. 32*512)

All of these but the last are duplicates of the bits from the starting point (that was obtained by physically sampling the circuit design emulation), and thus be used to verify that the software state replay model simulation was correct.

It should be appreciated, however, that various examples of the invention may employ other spacings (that is, other intervals between the capture of state values from the circuit design emulation are possible). Still further, some examples of the invention may alternately or additionally employ other starting points as well. For example, the replay could be of some set of time points in the middle of the capture buffer. (These could also be executed in parallel if multiple sets of 32 time points are desired to be replayed.) Still further, computational words of other sizes may be employed. For example, some implementations of the invention may use 16-bit, 64-bit, or 128-bit words to represent a net value over time.

Typically, the software state replay model will evaluate all of the combinational paths of the circuit design partition be evaluated in terms of the logical operations OR, AND, XOR, and Negation. Depending upon the circuit design, this may require that some netlist modifications be performed by the synthesis functionality of the emulator control system. For example, the synthesis functionality of the emulator control system may convert latches in the partition of the original circuit design into an equivalent module consisting of a bypass mux and a flop. Thus, when the synthesis functionality of the emulator control system creates the software state replay models for each partition (e.g., each FPGA) of the circuit design, it has replaced all of the structures in the original circuit design with software representations of logic amenable to parallel simulation. In addition to converting latches into flops, this process also may include, for example, converting tristate structures into logic trees, inserting no-flows, separating bidirectional input/output connections, and breaking clock-based flops into combinational loops.

With various embodiments of the invention, the model creation module 303 will not create the code for a software state replay model 307 directly from the information obtained from the emulator 100. Instead, it may first create a structure in memory (a "code IR" or "intermediate representation") whose nodes correspond to control and arithmetic structures and their operands. The model creation module 303 will then generate the executable code for the software state replay model 307 by walking through this structure. Thus, multiple code generation back-ends can co-exist with a single model creation kernel through the use of this intermediate form for code generation.

If the entire netlist in a partition is sensitive to the positive edge of a single clock, then the cycle simulation of the partition may be very simple:

initialize_states( )
   for cycle=1 to <number of cycles between state captures>:
      inputs-from trace(inputs)
      combinational_compute( )
      state_update( )

The cycle simulation may become more complex, however, if any flop in the partition design is clocked at a negative edge of the clock. Typically, the synthesis functionality of the emulator control system will provide timing analysis of every flop and net, so that the following information is known:

For each net, whether its value needs to be calculated on the negative edge of the clock, the positive edge of the clock, or both. More particular, the synthesis functionality of the emulator control system will usually provide edge sensitivity to determine when to potentially transport a net value through the virtual wires of the emulation system. "Transport" and "calculate" are isomorphic concepts, however so edge sensitivity determined for one purpose is identical to the edge sensitivity determined for the other.

For each flop, whether it is sensitive to the positive or negative edge of the clock.

Based upon this information, the regions of the netlist can be computed in an order that makes sense both for the topological order (i.e., what net values depend on other net values) and the sensitivity to a particular clock edge.

A region fed by nets which transition on both positive and negative edges of a clock signal must itself transition on both edges of the clock signal. For example, in the circuit shown in FIG. 4, the region "3", fed by a positively transitioning region ("1") and a negatively transitioning region ("2"), must itself transition on both edges of the clock signal. However, it is only really necessary to evaluate region "3" on both edges because it is sampled on both edges. Region "4" presents a different situation. Region "4" is driven by region "3", which transitions on both clock edges. As region "4" only obtains the value from region "3" on a positive clock edge however, region "4" need only be evaluated on the negative edge of the clock signal, as evaluation on the negative edge will capture changes both from the negative edge as well as the previous positive edge.

An algorithm for creating a software state replay model to evaluate this netlist might be created as follows:
Where:

```
calc_regionX evaluates cone X
foreach cycle: begin
  /* positive edge: */
  posedge_state_update( );
  calc_region1( ); // positive transition calc_region3( );
  // both edge transition
  /* negative edge: */
  negedge_state_update( );
  calc_region2( ); // negative transition calc_region3( ); // both edge
  transition calc_region4( ); // both edge transition, but sampled
          // next positive edge only
end
```

Thus, an algorithm for traversing a netlist to emit the associated software state replay model becomes more complex, when the software state replay model code needs to be created with functions that correspond to regions of edge sensitivity in the combinational logic, as described above. Further, these functions would need to be terminated when a transition is detected from one region of sensitivity to another, and a new function created. These transitions typically will be well-defined according to information conventionally provided by the synthesis functionality of the emulator control system. Furthermore, for each clock edge, a topological order must be determined among the functions generated in the software state replay model (e.g., calc_region2, calc_region3, calc_region4 for the negative edge in the algorithm above.)

In cases where there is more than one clock in a clock domain, there may be more than two distinct time intervals between successive rising edges of the slowest clock, where each time interval is demarcated by an edge on some clock within the domain. Flip-flops may change on any of these edges between intervals, and each flip-flop may change on any or all such edges. The description provided above may then be generalized to multiple clocks. It should be appreciated, however, that this process may become extremely complex in a circuit design partition having many clocks. Various examples of the invention may optionally reduce this complexity by introducing redundant evaluations, with the trade-off of making the software state replay model execute more slowly than it otherwise might.

Figure 4:
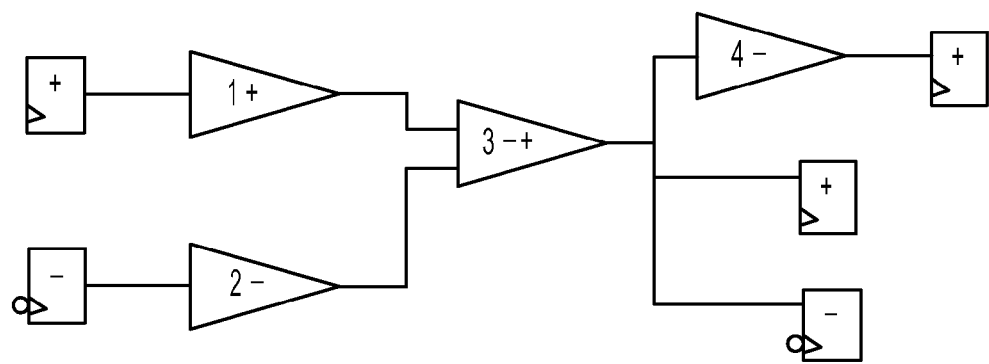
FIGS. 4-24 illustrate various example circuits and timing diagrams that may be modeled by a software state replay tool according to various implementations of the invention.

To consider an example of redundant evaluations, the entire netlist in FIG. 4 could correctly be evaluated twice a clock cycle. These evaluations could be achieved by creating a software state replay model with a single function to calculate all four cones of logic shown in the figure, with that function being evaluated on both positive and negative edges of the clock. With some examples of the invention, the software state replay tool 301 may have some limit to the number of clocks e (e.g., 4) that are evaluated optimally, and introduce non-optimal redundancy of evaluation for more complex cases.

Clock folding may also be applicable when creating a software state replay model. Clock folding is a technique whereby the slowest clock in a domain becomes a data signal which gates the logic relevant to that clock. This technique may be inherently implemented by the synthesis functionality of the emulator control system, however, to optimize the virtual wires data transfer for cases where most nets transition on a faster clock, and rarely on the slow clock.

It also should be appreciated that, when the software state replay model is created, data-dependent flops (i.e., flops whose clock inputs are driven by some cone of combinational logic) are converted by the synthesis functionality of the emulator control system to enabled flops that are synchronized to some edge of a user clock, and enabled by an edge produced by the cone of logic. The transformation performed by the synthesis functionality of the emulator control system is at the emulator clock level. Accordingly, the software state replay tool 301 will need to create its own transformation in the software state replay model for the user clock.

Figure 5:
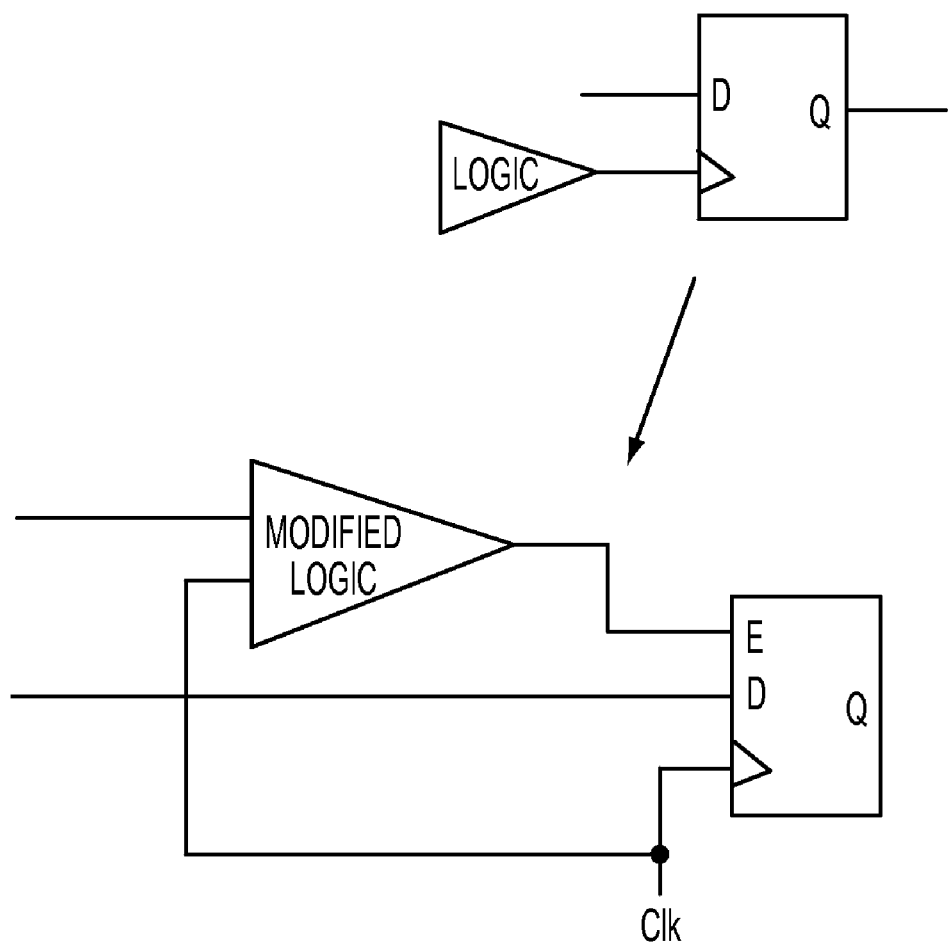

This transformation is illustrated in FIG. 5. This type of transformation is discussed in detail in, for example, U.S. Pat. No. 6,009,531, entitled "Transition Analysis And Circuit Resynthesis Method And Device For Digital Circuit Modeling" and naming Charley Selvidge et al. as inventors, and U.S. Pat. No. 5,649,176, entitled "Transition Analysis And Circuit Resynthesis Method And Device For Digital Circuit Modeling" and naming Charley Selvidge et al. as inventors, both of which patents are incorporated entirely herein by reference.

Depending upon the emulation system, a single FPGA will be limited to a particular number of clock domains (e.g., two (2) clock domains). As used herein, a domain refers to the circuit structures that operate on a clock signal having a period that is not an integer multiple (e.g., 2×, 3×, 4×, etc.) of the period of another clock signal and vice versa. Thus, for the purposes of the software state replay tool 301, a 2-domain FPGA could be considered to be two different FPGAs. The synthesis functionality of the emulator control system will route cross-domain nets through the periphery of the FPGA, so that transitions on those nets are sampled the same as cross-domain inputs from different FPGAs.

Because transition samples are available for all cross-domain nets, including those that originate within the same FPGA, the software state replay model simulation for each domain can be completely independent of the other. Therefore, each domain in a circuit design partition (e.g., the partition of a circuit design being emulated on a single FPGA) has its own separately compiled and executed software state replay model. Thus, when the software state replay tool 301 is invoked, it will be instructed which time domain to replay if the circuit design partition contains more than one time domain.

Figure 6:
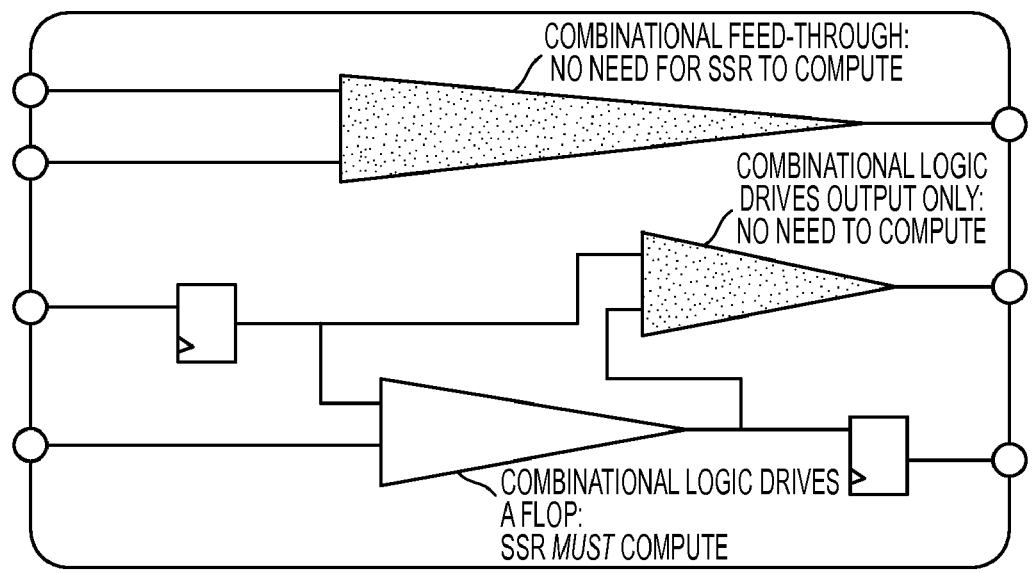

The software state replay tool 301 needs to calculate only the state values within each circuit design partition for each cycle. Another software tool 301 can then later use these state values to recalculate combinational net values as necessary. Consequently, circuit design paths in a circuit design partition that do not eventually drive a flop are irrelevant to the software state replay tool 301. For example, with the circuit diagram shown in FIG. 6, state values associated with shaded logic cones do not need to be computed by the software state replay tool 301.

The traversal algorithm that creates the software state replay model from the netlist of a circuit design partition operates by finding all flops in the circuit design partition, and then executes recursive descent code generation for the nets connected to flop "D" inputs. The nets need only be computed once, so the nets are marked during the traversal and not re-traversed if already marked. Marking implies that the value has already been computed and is available in the global net array in generated code. The traversal algorithm also takes into account the edge on which the flop is clocked, as well as the edge(s) on which the traversed nets must be evaluated.

With some examples of the invention, the software state replay tool 301 may employ forward traversal for netlist generation. While forward traversal provides some advantages, such as avoiding the use of excessive stack space during very deep recursion, with some implementations it could be more difficult to detect combinational regions that do not need to be computed, as noted above. By starting postorder recursion with nets connected to flop D inputs, it is guaranteed with a simple algorithm that a software state replay model is generated that corresponds to only those combinational regions that affect flops.

Figure 7:
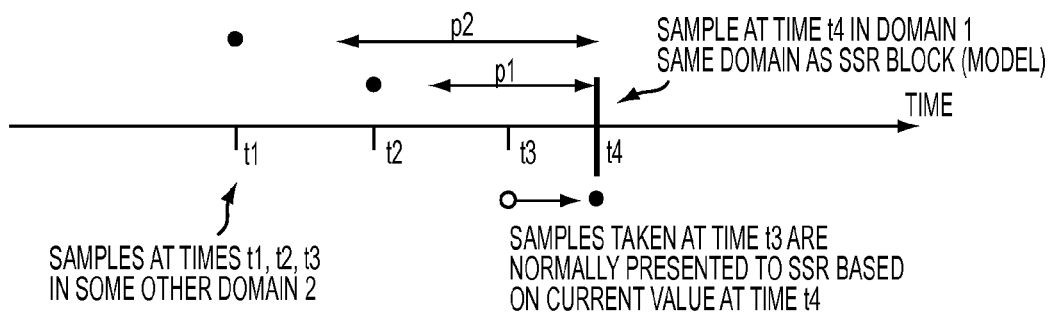

It should be noted that, with cross domain situations, a "previous" input may be mean more than 1 previous input (i.e., the immediately previous input). This situation is graphically illustrated in FIG. 7. Accordingly, with various examples of the invention, input samples are made when the input changes, i.e., at the time point <clock edge>+<transport delay> for that particular input. (Repetitively scheduled nets are a different case, as will be described in more detail below.) This sampling point is ordinarily hidden from the software state replay tool, and the input trace interface delivers whatever the current value is for an input, with respect to the domain of the model. As previously noted, a software state replay model is only of a single domain. Thus, as illustrated in FIG. 7, different path lengths may require different "previous" input samples; there may not be a single previous input.

From the software state replay model's point of view, the request for a "previous" input depends upon the original input signal name and the path length between the input and the time it is sampled at a flop. It should be noted that by the time the model is built, all cross-domain inputs will have a unique path length, because paths of different length will have been split. Further, split inputs will not really exist as separate samples in the input stream, and will instead be calculated from some existing input and the path length.

This path length difference may be considered a type of skew, because the skew is applied backward from the sample point within the models domain, and the closest previous input selected as the necessary value for the cross-domain input. This type of skew information may be provided for all cross-domain inputs, even those that are not split. Also, the one-to-many map between cross-domain inputs and skews (or path lengths) can be made available after the model has been generated. It should be noted, however, that skews need to be applied to individual bits in the time sliced inputs, as relative previous sample times may be different for all bits. It also should be noted that this may be a very inefficient process if there are many cross-domain inputs and many path lengths from them.

Transport delays are not relevant to the model for cross domain inputs, assuming the interface discussed above is employed (with an exception for repetitively scheduled inputs, as previously noted.) In order to determine the actual time of a cross-domain input sample, however, the transport delay will need to be taken into account. This is because only clock timestamps are recorded, and the actual sample time must be calculated from the timestamp for the domain clock edge and the transport delay to the cross-domain input. This calculation, however, may be hidden in the software state replay tool input data processing layer outside of the model itself.

Both pipeline flops and no-flows will also be taken into account when creating the software state replay model of a partition of a circuit design. A pipeline flop is a D flip-flop clocked with the emulator clock that inserts a 1-vcycle delay in the path in which it is inserted. These will be present in the netlist to break combinational loops. A no-flow is a special case of a pipeline flop that will be present in the netlist to break combinational paths that do not need to be considered as such during the timing analysis performed by the synthesis functionality of the emulator control system. These are inserted into the emulation at the user's direction. Both pipeline flops and no-flows must be considered by software state replay model for the purpose of stopping a traversal. The use of pipeline flops to break loops, however, implies that the software state replay tool 301 does not need to perform loop detection of its own when creating a software state replay model.

With some examples of the invention, the software state replay tool 301 may calculate the output values for all no-flow and loop-breaking pipeline flops, as an aid to reconstruction. This would eliminate the need for reconstruction to deal with combinational loops at all. There is potential disadvantage, however, if there are very many of these flops in a design, thereby causing the software state replay tool 301 to produce a very large output database. Accordingly, various examples of the invention can make the calculation of the output values for all no-flow and loop-breaking pipeline flops optional as desired by the user.

If a net crosses two domains, then the state value of the net is sampled at the FPGA boundary, whether driven from a different FPGA or the same FPGA. Therefore cross-domain nets are always cross-domain inputs, as illustrated in more detail below.

Figure 8:
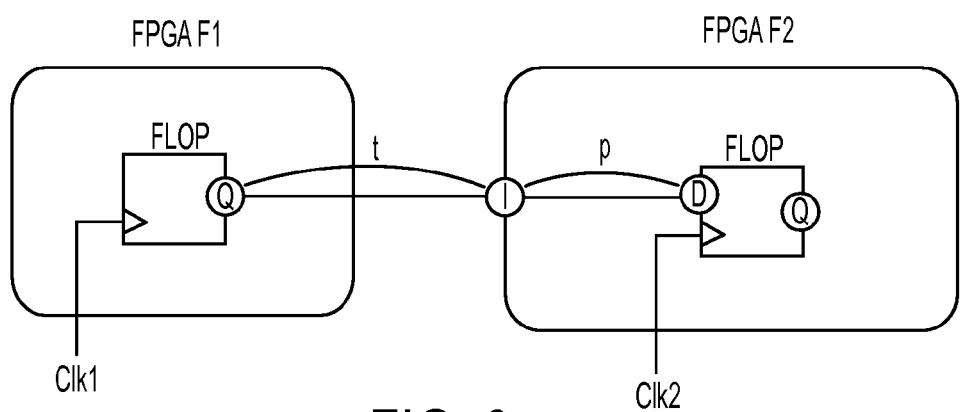

FIG. 8 illustrates an example of a cross-domain net. As seen in this figure, the clock signals Clk1 and Clk2 are asynchronous clocks, creating a domain in FPGA F1 that is different from the domain in FPGA F2. Also, the Q output of the flop in FPGA F1 transitions each cycle of the clock signal Clk1, while the input D to the flop in FPGA F2 is sampled on each cycle of the clock signal Clk2. The Q output of the flop in FPGA F1 then is transported to the input I of the FPGA F2 with a transport delay of "t", where "t" is some number of vcycles. The input I of the FPGA F2 then is sampled on the vcycle in which it changes, i.e., edge(Clk1)+t, while the input I of the FPGA F2 is available as the D input of the flop in FPGA F2 after a "pipeline" delay of "p", where "p" is some number of vcycles.

As will be appreciated from this figure, the cross-domain net potentially introduces an inconsistency between the trace sample of the input I of the FPGA F2 and the value that must be sampled at the D input of the flop in the FPGA F2 for the state update. That is, in a cross-domain case, the interval between clock edges is in principle unpredictable, and inconsistencies may occur. This is because the value sampled at the input I of the FPGA F2 may meet the setup time of "t", while the value sampled for the D input of the flop in the FPGA F2 may not meet the setup time of "t+p".

Figure 9:
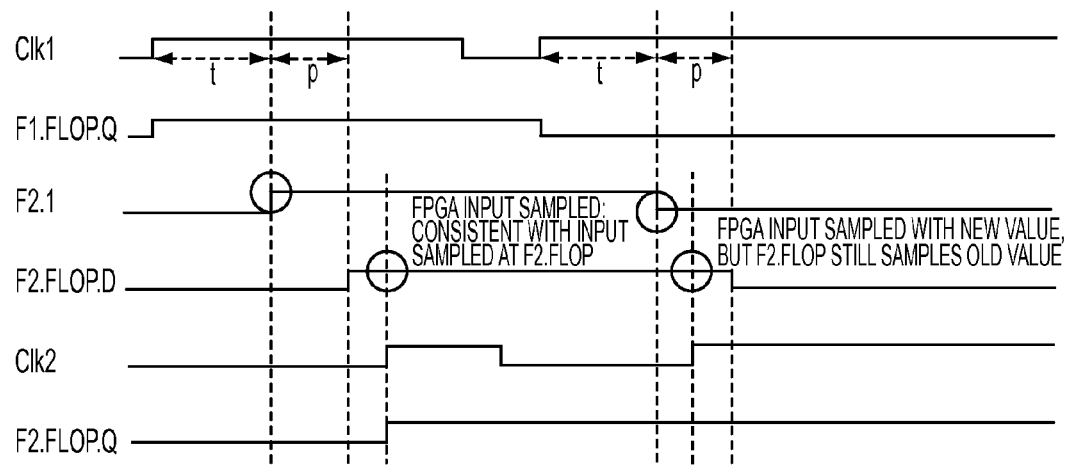

As shown in FIG. 9, the input I to the FPGA F2 may be sampled as soon as it changes). In the cross-domain case, as illustrated on the second cycle of Clk2, this sample may be inconsistent with the value that is sampled at the flop. In order to properly model the operation of a cross-domain case like that illustrated in FIG. 8, the inconsistency between the sampled FPGA input and the value that must be sampled at the flop means that software state replay tool 301 must use the previous input value to calculate the state update. More particularly, the effective algorithm depends upon the path length between the FPGA input and the flop D input, which is "p" in the example, as well as the time between edges of Clk1 and Clk2. Both these values are measured in vcycles. The algorithm may therefore be described as:

```
time_between_edges := timestamp(posedge Clk2) -
   timestamp(posedge
Clk1); if
(time_between_edges < t)
   use sampled input for state update
calculation else if (time_between_edges >= t+p)
   use sampled input for state update
calculation else*
   use previously sampled input for state update calculation
```

With various implementations of the invention, this algorithm may be incorporated in the input stream to the software state replay model. With these implementations, no changes to the software state replay model itself are required beyond the path duplication discussed above. It also should be noted that, with various examples of the invention, clock edges may not explicitly time stamped. Instead, however, 8-bit deltas between edges may be available to software state replay tool 301, from which timestamps may be computed.

Figure 10:
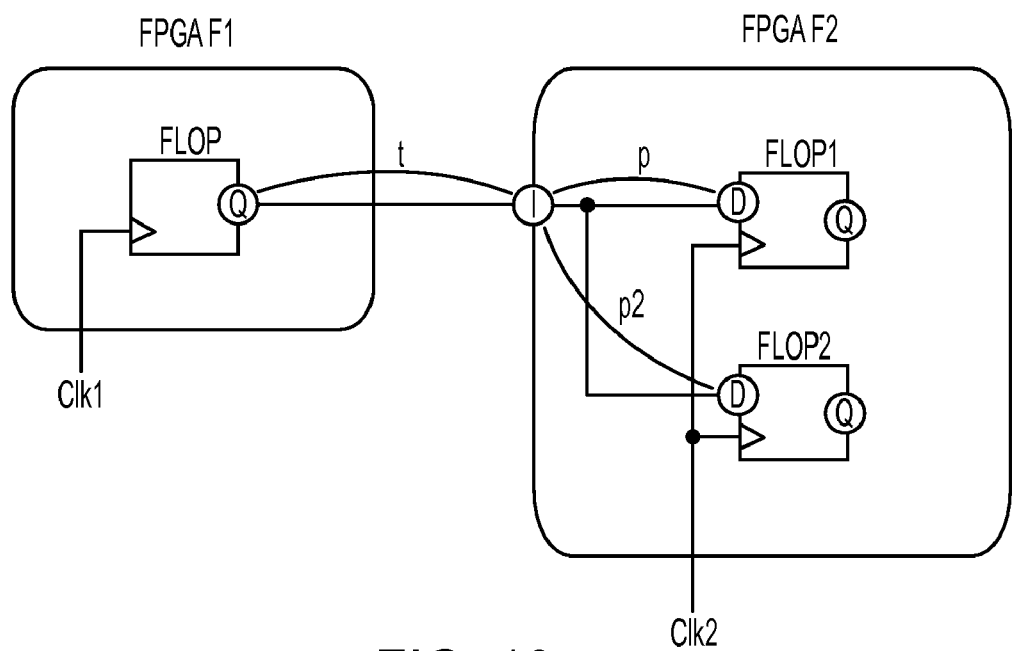

The problem of modeling cross-domain nets becomes more complex if there are multiple paths which sample nets that transition on another clock domain. For example, FIG. 10 illustrates a cross-domain net with multiple paths. In this example, the pipeline delays p1 and p2 might be different. If so, then there might exist points in time where one but not both of the flop D input samples are inconsistent with an input sampled at I, following the reasoning discussed in detail above. As a result, the nets need to be split.

Figure 11:
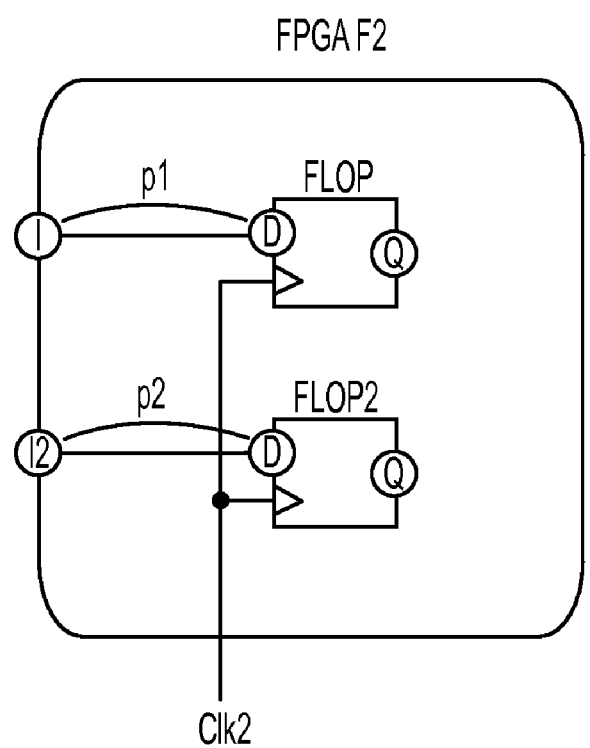
Figure 12:
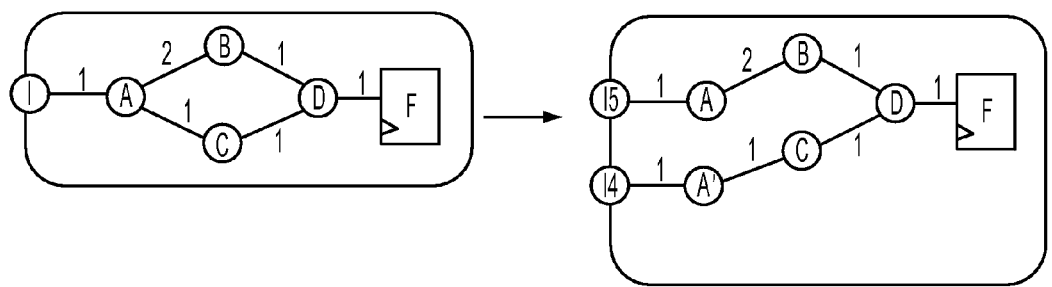
Figure 13:
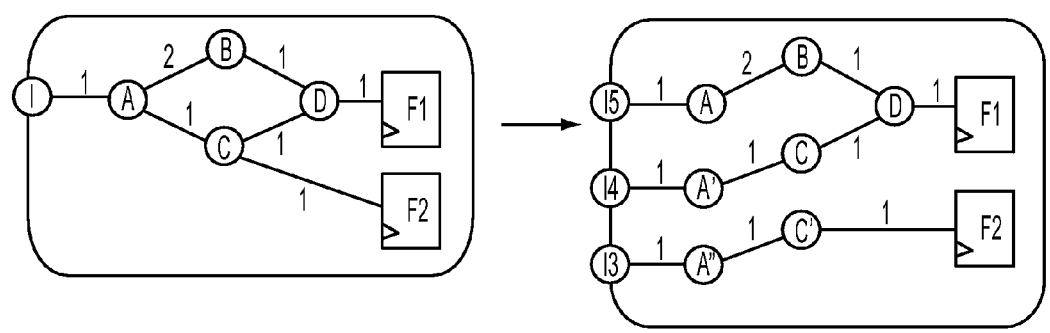

After splitting, inputs for I are duplicated in most cases to produce inputs for 12, as graphically illustrated in FIG. 11. The situation where the inputs differ is based on the algorithm for adjusting input values as discussed in detail above. In this situation, the inputs would differ because I has an associated pipeline delay of p1, while 12 has a delay of p2. Therefore, each input has a different region of time in which input samples would be inconsistent with flop data samples. Of course, there may be more complex netlists with, for example, reconvergent fan-out and different path lengths along each net. For these more complex arrangements, not only the inputs but also the associated logic would be duplicated, as illustrated in FIG. 12. In this figure, the input labeled "I5" is the input with path length of 5 to a flop, while the input labeled "I4" is the input with path length 4 to a flop. The node "A" is duplicated with node "A'" to reproduce the logic correctly. The netlist configuration may yet be more complex with another flop introduced. As shown in FIG. 13, the additional flop produces a path of length 3 from input I, and requires still more logic duplication.

Figure 14:
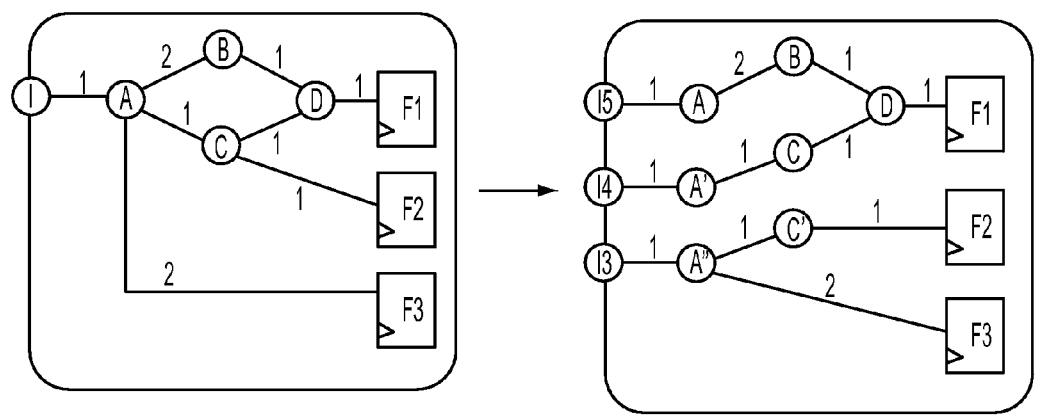
Figure 15:
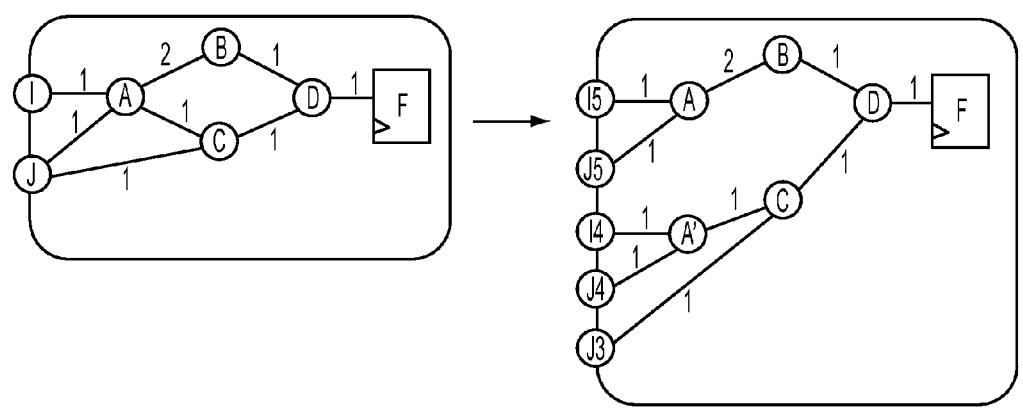

It should be noted, however, that the addition of a flop will not necessarily require the duplication of an input or of logic if it does not add a new path length to the netlist. An example of this situation is illustrated in FIG. 14. A second cross-domain input may also complicate the model, as illustrated in FIG. 15.

From the foregoing examples, some general principles for a path-splitting algorithm to model a reconvergent fan-out netlist with two inputs emerge. For as many different vcycle path lengths as there are from a cross-domain input to a flop data input, there must be that many inputs in the model. For example, if there are three different vcycle path lengths, the input must be duplicated twice to produce three different inputs. Also, logic elements must be duplicated as necessary when inputs are duplicated, in order to preserve the logical integrity of the netlist (i.e., it must compute the same logic value.) If a logic element lies along two different paths of different vcycle length, it may be shared only if all paths leading from that logic element forward to flop data inputs all have the same vcycle length. The node "D" in the previously-described examples above is an example of this. While the previously-discussed examples did not describe the situation where a node "D" has a multiple fan-out meeting this condition, but they will be appreciated from the foregoing explanation.

Repetitive scheduling is a technique that may be applied to some nets that transition on two time domains. This type of configuration introduces an unreliability in FPGA input sampling for the software state replay tool 301. In general, a net which transitions on two time domains is sampled twice at the input to the FPGA: at the vcycle in which the net might change with respect to each time domain. The repetitive scheduling case thus introduces multiple time points at which a net might change.

Figure 16:
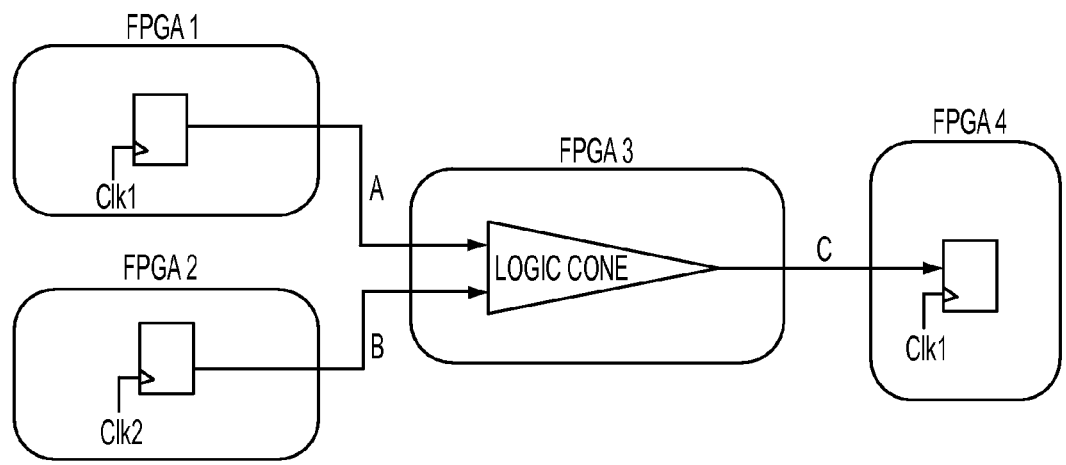
Figure 17:
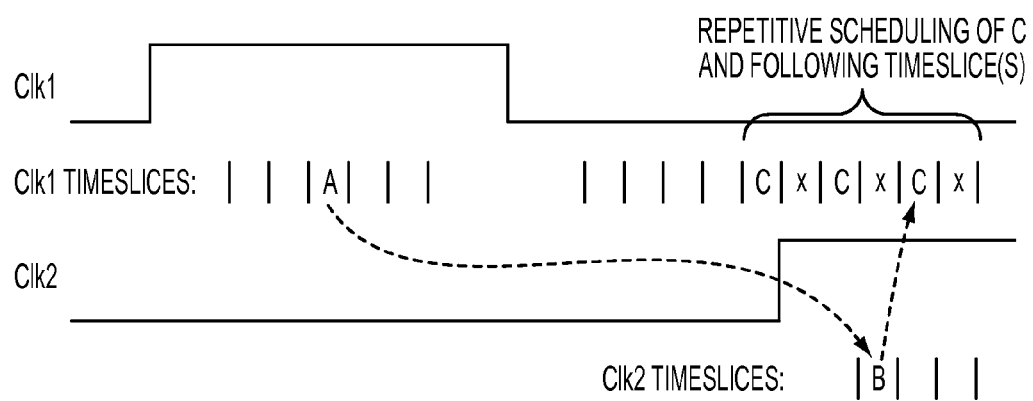

FIG. 16 illustrates an example of a netlist using repetitive scheduling. In this figure, net values that are transported between FPGAs must occupy a particular time slice in the virtual wires multiplexing over the physical FPGA interconnect. In other words, each net value can be said to be transported on a particular vcycle. Transport is always with respect to a particular user clock that is relevant to the transitioning and sampling of the net. In this figure, the values on net A are transported with respect to Clk1, as are the values on net C. Values on net B are transported with respect to Clk2. These values will be transported on vcycles that follow an edge of the clock. FIG. 17 illustrates a timing diagram showing the time slices available for transport in each clock domain (Clk1 and Clk2). More particularly, this figure shows transport with so-called "repetitive scheduling." The dotted line shows how net transitions would affect each other (implicitly assuming intra-FPGA transport delays of 0, which is not generally true, but the general principle nonetheless still applies.)

Repetitive scheduling is used when the dependency of C on B is recognized by the compiler. Transport of values on net C (and any other values scheduled for transport after it) is scheduled iteratively as long as Clk1 is held low. This allows transitions on B to influence C as long as some minimum setup time is met. Without repetitive scheduling, the result of a transition on net B could be missed on net C, while still maintaining a correct setup time with respect to the next positive edge of Clk1. In fact, a transition on net B could be dropped entirely in some circumstances, particularly when Clk1 is held still.

For example, referring to the timing diagram illustrated in FIG. 17, in case 1 the transition on Clk2 edge cannot be seen on next edge of Clk1 because transport of B follows transport of C. With Case 2, the transport is interleaved well, as B precedes C, but the previous transition on B is missed entirely. Repetitive scheduling avoids this problem by scheduling the transport of C repeatedly throughout the negative edge of Clk1. Referring back to FIG. 15 the sampling of net C will be on some time slice, i.e., one of the repetitively scheduled time slices in which C could potentially be transported, but not necessarily the time slice on which C was actually transported. With various examples of the invention, sampling at all repetitively scheduled time slices would introduce too much overhead in the FPGA input sampling. Therefore, repetitively scheduled nets are inherently ambiguous in the input samples provided for the software state replay tool 301.

Repetitively scheduled nets are comparatively rare. The software state replay tool 301 must find an FPGA input sample that drives the cone of logic, where that input is not repetitively scheduled. The synthesis functionality of the emulator control system can also strive to reduce the probability that an input is a repetitively scheduled net. If a configuration like the netlist shown in FIG. 16 is observed by the software state replay tool 301, the cone of logic in FPGA 3 would have to be included in the software state replay model for the FPGA 4, and the input samples for nets A and B would have to be included in order to properly evaluate the cone of logic. Input B would be a cross-domain net to which the previously described handling of cross domain nets would apply.

Combinational loops represent another situation where vcycle-based races may affect the outcome of evaluating a circuit. While combinational loops are rare, combinational loops in general require some evaluation for every vcycle in which values may potentially change. With various examples of the invention, the synthesis functionality of the emulator control system may break up combinational loops with a vclocked flop. This flop acts as a delay buffer to ensure that the circuit has predictable behavior. Placement of this delay is arbitrary except insofar as it breaks the loop.

Figure 19:
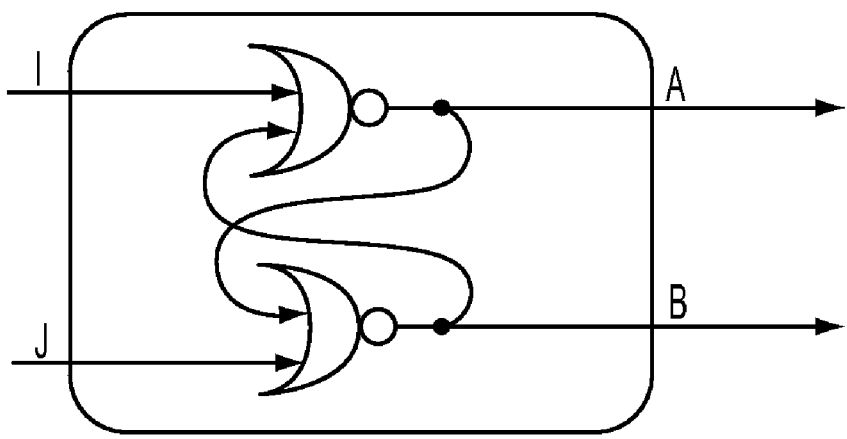

It should be noted that combinational loops can inadvertently create latches, such as shown in FIG. 19 where two logical NOR circuits are wired together. In this figure, the circuit outputs A and B assume the following values depending on the inputs I and J:

| I | J | A | B |
|---|---|---|---|
| 1 | 1 | 0 | 0 |
| 1 | 0 | 0 | 1 |
| 0 | 1 | 1 | 0 |
| 0 | 0 | unchanged | |

If the pair of values (I,J) fall on the same user clock edge from (1,1) to (0,0), the output of the circuit depends on whether the pair of values passes through (1,0) or (0,1) first. In short, the output of the circuit depends on the outcome of the race between I and J each falling to 0. If I falls first, then the (I,J) pair will momentarily pass through the value (0,1), so that the (A,B) output latches as (1,0). If J falls first, then (I,J) passes through (1,0), which latches the output as (0,1).

Some combinational loops will oscillate, and since they may introduce an inconsistency, they must be recognized by the software state replay tool 301. FIG. 19 illustrates one example of an oscillating loop. As seen in this figure, if inputs to the illustrated circuit are (1,1), then the output value will oscillate between 0 and 1. If simulated on a software simulator, a zero-delay loop would be detected for this circuit. With various implementations of the invention, the synthesis functionality of the emulation control system will insert a vclock-based flop on one of the feedback paths, so that the circuit will oscillate with a period of 2 vcycles. If the oscillating output is sampled after an odd number of vcycles, the result would be different than if sampled after an even number of vcycles. In other words, clock jitter alone could produce an indeterministic result.

Thus, modeling combinational loops has the following difficulties. First, combinational loops depend on the vcycle path lengths of inputs to a loop, as well as the path lengths within the loop. Second, the path lengths are not known until FPGA place and route operation is performed. To address these difficulties, various implementations of the software state replay tool 301 will reevaluate a combinational loop for every vcycle on which its values may potentially change.

More particularly, as will be appreciated by those of ordinary skill in the art, combinational loops can oscillate, glitch, and latch. It is not in general possible to predict the behavior of a combinational loop without simulating it. Combinational loops can oscillate temporarily (i.e., as two or more inputs are racing each other) while still ultimately stabilizing within the user clock cycle. The results of any oscillation and glitching could potentially influence latching behavior, which affects the output of the circuit. Thus, various implementations of the software state replay tool 301 will simulate a combinational loop on a vcycle basis. Some embodiments, however, may minimize the number of vcycles to be evaluated.

For example, with some implementations of the software state replay tool 301, the tool 301 would identify the set of nets that are part of the same combinational loop. A net is part of a loop (hereafter referred to as a "loopback path") if it has a combinational path that can be traced back to itself. Nets are part of the same loop if any of their loopback paths intersect. There may be, for example, a reconvergent fan-out within a loopback path, in which case all paths along the reconvergent fan-out belong to the same loop. The software state replay tool 301 will also identify the set of inputs and outputs to the loop.

Figure 18:
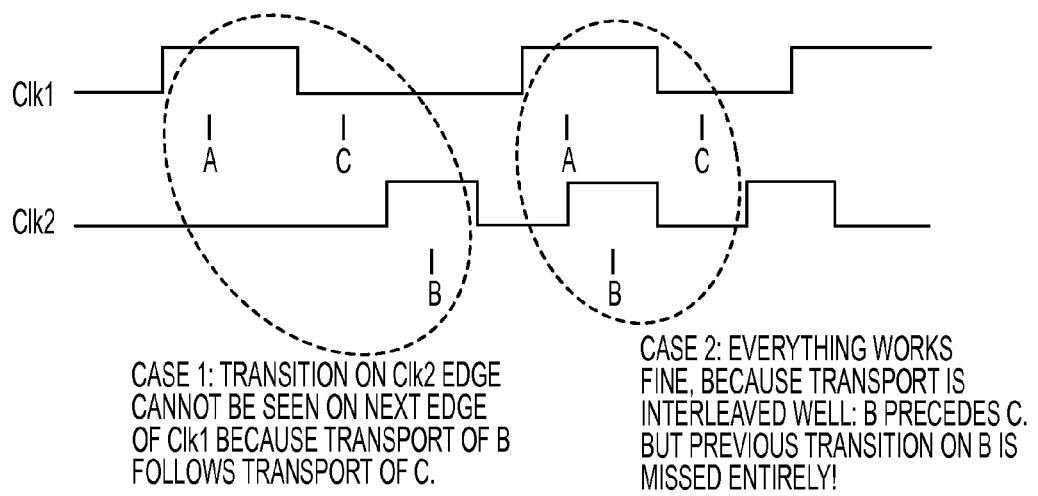

Still further, the software state replay tool 301 will expand the combinatorial loop "region" to include any combinational loops that lie along input or output paths. That is, the region would thus include all combinational paths that may affect each other through oscillation, glitching, or latching in combinational loops. After the region is fully expanded, the software state replay tool 301 can determine a final set of input and output nets. For example, FIG. 18 illustrates a set of group of combination loops. Loop 1 contains reconvergent fan-out along the loopback path. Loop 2 is disjoint from Loop 1, but must be considered as part of the "combinational loop region" because glitches produced as outputs of Loop 1 may affect the evaluation of Loop 2.

It should be appreciated that the synthesis functionality of the emulation control system typically will perform most of this analysis, creating a level of hierarchy per loop in what is referred to as "loop encapsulation", so that feedback is buried within the hierarchy and loop I/O identified as I/O to the hierarchy. It may not typically include, however, adjacent loops (such as "Loop 1" and "Loop 2" illustrated in FIG. 18) in the same loop encapsulation.

Next, the software state replay tool 301 will identify path lengths into and within combinational loop region. Typically, from the place and route functionality of the emulation control system for a FPGA the software state replay tool 301 should receive the vcycle path length of input nets to the combinational loop region, as discussed above. It also should receive an identification of the nets within the combinational loop region that have non-zero path lengths. Typically, the netlist produced by the synthesis functionality of the emulation control system will identify the location of the loop-breaking vclocked flop inserted to break the loop. This effectively creates a path length of 1 along the path in which the flop was inserted.

The software state replay tool 301 will then identify the vcycle path lengths through the combinational loop region by summing the vcycle path lengths along each non-looping path from input to output of the combinational loop region.

For nodes which lie on a loopback path, its adds the maximum vcycle path length along the loopback path to the sum of vcycle path lengths.

With various examples of the invention, the algorithm for evaluating combinational loops will rely on the presumption that the loop must stabilize within the maximum vcycle path length across the combinational loop region, taking into account loopback vcycle path lengths. The algorithm thus simulates each vcycle through the loop, and adds 1 more cycle to detect oscillation if present. Inputs to the combinational loop region are staggered according to their own arrival times according to their own vcycle path length, and the number of iterations of the algorithm is:

cycles needed to capture all inputs+maximum vcycle path length through the loop region+1(to detect oscillation)

It should be noted that vcycle path lengths of greater than 1 on a net internal to the combinational loop region are implemented by modeling the path length as a delay buffer, such as by splitting the net into two components and moving the value from one part of the split to the next. With various examples of the invention, this process may be performed as follows:

```
cycle_count = 0
apply first input(s)
while (cycle_count < max_cycles_to_stabilize + 1)
    if (cycle_count is appropriate)
        apply other input(s)
    evaluate combinational code evaluate
    delay buffer(s) save selected state
    cycle_count ++
if (oscillation detected) exit with
    error
```

Figure 20:
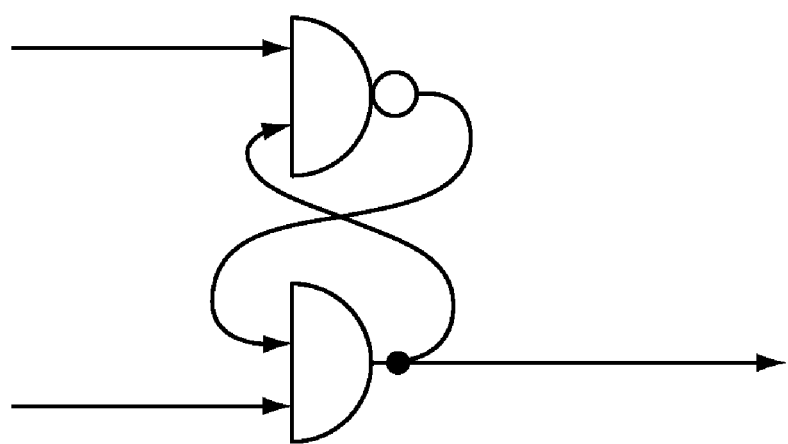

The operation of this process will be apparent with reference to the potentially oscillating feedback between the NAND and AND logical operators in the example circuit illustrated in FIG. 20. In this figure, the nets have been labeled A, B, C, D, and E. It should be noted that, in this example, the synthesis functionality of the emulation control system has inserted a loop-breaking flop between D and C. Net C then is a new net introduced to model the delay of the loop-breaking flop.

If the vcycle path length to A is 4, and the vcycle path length to B is 8, then the algorithm needs to execute seven times. This is:

8−4+1//cycles to run to deliver all inputs+1//max path through the loop C-E-D+1//1 more cycle to detect oscillation This code will correctly evaluate the loop as follows:

```
num_cycles_to_run = 7;
delta_path_A_B = 4;
A = new_value_of_A;
// B retains old value of B, for time being
cycle_count = 0;
while (cycle_count < num_cycles_to_run)
{
if (cycle_count == delta_path_A_B) B =
    new_value_of_B;
// combinational code:
E = !(A&C);
D = (E&B);
// "state update" of "pipeline":
prev_C = C; // save previous value to detect oscillation C = D; //
update delay buffer
}
if (C != prev_C)
    return OSCILLATION
```

The order of the combinational code is determined by postorder recursive descent code generation from the input of the loop-breaking flop. It should be noted, however, that this example yields an oscillation if both A and B change to 1, but it will also temporarily oscillate for 4 cycles if A moves from 0 to 1 and B moves from 1 to 0, due to the race between A and B.

The simulation algorithm described above simulates more vcycles than may be strictly necessary, based on input changes or total number of different path lengths through the combinational loop region, but this may be useful in order to simulate oscillations which occur temporarily while input races occur. Alternatively, the software state tool 301 could employ an algorithm that detects such oscillations instead of simulating them, on the presumption that all oscillations are bad, whether or not they occur temporarily during input races. With the circuit illustrated in FIG. 20, for example, this alternative approach would save 1 cycle of simulation. For this example, the algorithm might operate as follows:

a.-cycle 0: apply input A and simulate
b.-cycle 1: simulate loop again to incorporate feedback
c.-cycle 2: simulate again to potentially detect oscillation
d. cycle 3: SKIP! . . . no need to simulate
e. cycle 4: apply input B and simulate
f. cycle 5: simulate loop again to incorporate feedback
g.-cycle 6: simulate again to potentially detect oscillation It should be noted that oscillation detection may in general be subtler than this example suggests. If the loopback path length is 1 vcycle, then oscillations will occur with alternating values each vcycle: 0,1,0,1, etc. This is easily detected as state !=prev_state. If the loopback path length is greater than 1, oscillations could be of a pattern 0,0,1,1, and so forth. It also should be noted that, if the simulation is performed with 32-bit-parallel data as described above, oscillations may occur in only a minority of bits.

As will be appreciated from the foregoing discussion, various implementations of the software state replay tool 301 should be able to accept variable path lengths within the combinational loop region based on data delivered for a FPGA by the place and route functionality of the emulator control system. Accordingly, these embodiments will model pipelines within the loop. Paths of length greater than 0 are modeled with "delay buffers" to produce the correct sequences of "events" within the loop.

Different path lengths on inputs to the combinational loop region are easily handled by, for example, assigning values to the variables "num_cycles_to_run" and "delta_path_A_B" in the simple example illustrated in FIG. 20. It should be appreciated, however, that different paths within the loop are not so easily handled. With various implementations of the invention, the software state replay tool 301 will emit a netlist database from information provided by the synthesis functionality of the emulation control system, and traverse that database after delays are known in order to create the model for the combinational loop.

Various implementations of the software state replay tool 301 may employ one or more additional optimizations. For example, some implementations may skip some cycles if it can be demonstrated that inputs have not changed (e.g., for the 32 bit processing described above, that the 32 parallel input bits would not have changed, as the simulation is of 32 bits of data at different points in time). Also, the simulation of the combinational loop region can be incorporated as a subroutine called by a combinational compute section of the software state replay model software.

Some latches and flops have asynchronous preset or clear inputs (or potentially both a preset and a clear) that force a Q output immediately to 1 (preset) or 0 (clear) when asserted. With various implementations of the invention, these may be modeled asynchronously. As soon as the vcycle arrives at which the preset or clear input is valid, if that input is asserted, the Q output of the latch or flop is preset or cleared immediately, and propagates combinationally forward.

Because the state element only responds to the assertion of preset or clear, a glitch in the logic cone driving preset or clear have an effect in that the transient transition 0->1->0 has the same result as 0->1 because only the positive edge matters. If a glitch matters to the design state, that is a design bug, but it is important that the software state replay model take such conditions into account. The software state replay models glitches on a vcycle basis, with input signals racing based on vcycle path length The following Verilog descriptions set forth the operation of a flop and a latch with a preset and clear:

Verilog for a flop with both preset (PRE) and clear (CLR):
always @(posedge CLK or posedge CLR or posedge PRE) begin

```
            if (CLR)
                Q <= 0;
            else if (PRE)
                        Q
            <= 1;
                else
                        Q <= D;
            end
```

Verilog for a latch (enabled latch) with both preset and clear:
always @(ENA or D or GATE or CLR or PRE) begin

```
            if (CLR)
                Q <= 0;
            else if (PRE)
                Q <= 1;
            else if (ENA && GATE)
                Q <= D;
            end
```

Figure 21:
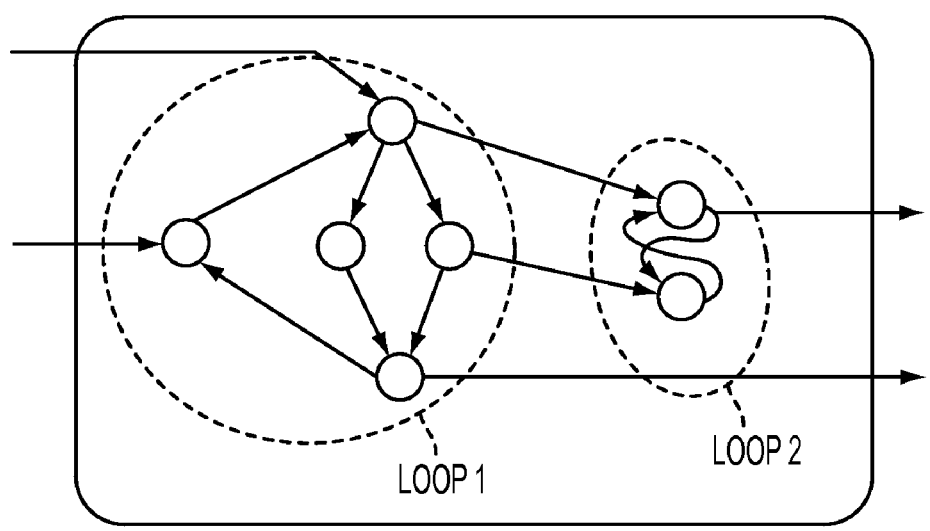

FIG. 21 illustrates a simple example of a circuit having an asynchronous preset. In this figure, the numbers associated with the inputs on the left hand side represent the path lengths (in vcycles) into the logic cone driving preset. The cone and the state element then are evaluated as many times as there are distinct path lengths through the logic cone. Accordingly, the software state replay model will employ a technique to represent older values and newer values at inputs to the cone, with older values overridden by newer values as required by the order of evaluation. Also, the software state replay model will evaluate the state element as follows:

state[$i$]=(PRE&0x$FFFFFFFF$)|(~PRE&state[$i$])

This will have the effect of sticking the state at 1 as soon as preset is asserted for each bit.

It should be noted that, if the example circuit involved an asynchronous clear operation rather than a preset, the logic would differ only in the constant logically ANDed with the CLR value, as follows:

state[$i$]=(CLR&0x00000000)|(~CLR&state[$i$])

Likewise, if the "CONE" in the FIG. 21 were a three-way AND, an example evaluation would be:

```
for ( paths=0; paths<3; paths++ ) {
    // Apply inputs in the order of path
    lengths: switch(paths) {
        case 0: C = new__C; break; // first set input changes
        case 1: B = new__B; break; // second set case 2: A
        = new__A; break; // third set
    // Evaluate the cone:
    C1 = A&B&C;
    // Evaluate the state element based on preset:
    state[i] = (C1&0xFFFFFFFF)|(~C1&state[i]);
    }
```

The result of the third iteration would represent the synchronous (settled) evaluation of the cone, but if positive glitches were created in earlier evaluations, the state evaluation would stick at 1.

There is some possibility that flops and latches with both presets and clears will be implemented in some fashion that has simpler behavior than if a flop or latch really had both features implemented asynchronously. However, various examples of the invention may model PRE and CLR asynchronously. With these embodiments, the PRE and CLR driving logic cones are evaluated in vcycle order, as above. Also, the state is evaluated for both PRE and CLR, and precedence is given to the appropriate action: preset or clear. In the Verilog description above, the CLR signal takes precedence. This may be modeled in the software state replay tool 301 by evaluating the CLR second, so that if both PRE and CLR are asserted on the same iteration, the CLR would take effect.

Figure 22:
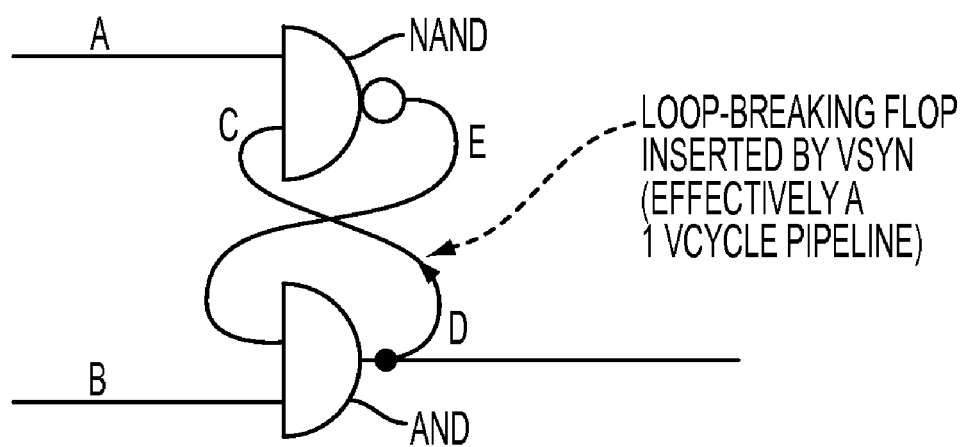
Figure 23:
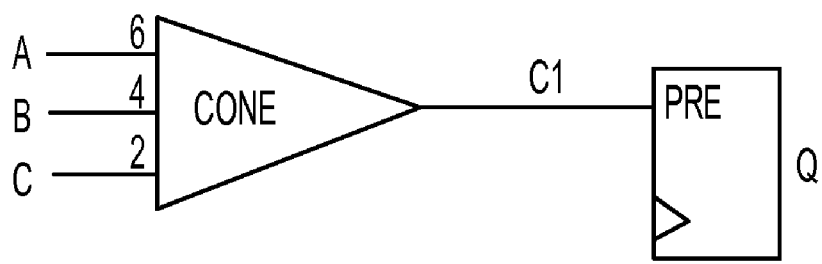
Figure 24:
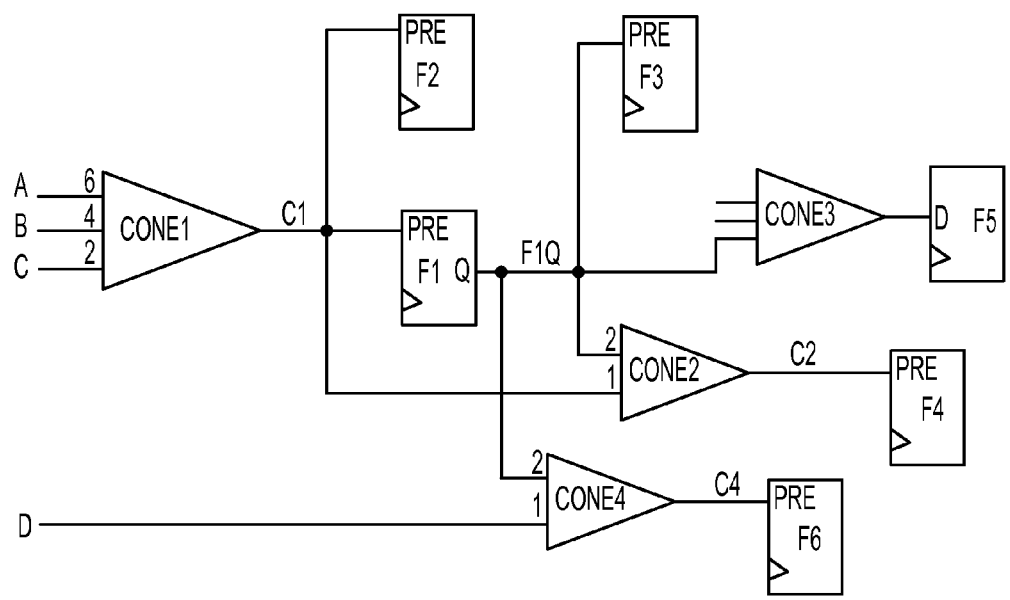

FIG. 22 illustrates a more complex example of a circuit with preset paths. As seen in this figure, two preset paths share the same logic cone: F1/PRE and F2/PRE. This circuit also includes a preset path with another preset: F3/PRE, F4/PRE, and F6/PRE, and a preset path with reconvergent fan-out: F4/PRE, a preset path with preset and other inputs: F6/PRE. Still further, it has a "normal" combinational logic cone including a preset path: CONE3.

The modeling solutions for some of these are easily described. When two or more presets share a path, their states must be evaluated as follows:

F1_state=(C1&0x$FFFFFFFF$)|(~C1&F1_state);

F2_state=(C1&0x$FFFFFFFF$)|(~C1&F2_state);

after evaluation of the logic cone producing the path value. The ordering of these state evaluations does not matter. There would be as many evaluations of these states as paths through the cone driving C1.

When a preset path is driven by a single signal, whether that signal comes from a primary input to the FPGA, or from another preset, as F3/PRE is driven by the output of F1 in the example above, it only need be evaluated once. This is the same as a "normal" cone of combinational logic that might be driven from the output of a flop with preset. It should be noted, however, that the evaluations of simple paths must occur after the iterative evaluation of the more complex preset path:

iterative_eval_of_flops_F1_and_F2( ); //more complex presets F1Q=F1_state; //propagate net value from state F3_state=(F1Q&0x*FFFFFFFF*)| (~F1Q&F3_state); //simple preset evaluate_ CONE3( );

The more complex cases are those involving, in the example illustrated in FIG. 22, CONE2 and CONE4. The preset that CONE2 drives, F4/PRE, can be driven along 6 different path lengths. Paths through CONE1 reconverge through paths of length 1 and 2. That results in path lengths of 3, 4, 5, 6, 7, and 8. Accordingly, the following conclusions can be drawn regarding CONE2. First, it needs to be evaluated 6 times. Also, it must be evaluated with the proper relationship to CONE1. Further, the pipeline delay must be modeled. With this example, the pipeline delay must be modeled in order to stagger the effect of CONE1 through the 2-delay path along net C1, as well as the 1-delay path through flop F1.

Modeling the operation of CONE4 is simpler, but it introduces an evaluation with pipeline delay of 1 through input D. Inputs A, B, and C produce paths through F1/PRE of length 4, 6, and 8. When complex topologies like this are present, the software state replay tool 301 will identify all connected preset paths, and evaluate the number of different path lengths through all connected preset paths. Further, the software state replay tool 301 will perform the evaluation iteratively, for as many times as there are distinct path lengths through all connected preset paths and in correct topological order. Still further, the software -state replay tool 301 will model pipeline delay in cases of reconvergent fan-out; i.e., when topological order alone will not suffice to guarantee order of evaluation.

Thus, the example of the complex preset path circuit illustrated in FIG. 22 may be evaluated as follows, assuming all cones are ANDs:

```
for ( cycle=1; cycle<=8; cycle++ ) {
    // Apply inputs on appropriate cycle:
    if(cycle==1) D = new_D;
    else if (cycle==2) C = new_C;
    else if (cycle==4) B = new_B;
    else if (cycle==6) A = new_A;
    // Evaluate CONE1 and flops F1 and F2:
    if (cycle==2 || cycle==4 || cycle==6) { C1 =
        A&B&C;
    F1Q = state_F1 = (C1&0xFFFFFFFF)|(~C1&state_F1);
    state_F2 = (C1&0xFFFFFFFF)|(~C1&state_F2);
    }
    // Evaluate CONE4 and flop F6:
    if(cycle==1 || cycle==4 || cycle==6 || cycle==8) {
        C4 = D&F1Q; // could be F1Q_delay2, but doesn't matter
        state_F6 = (C4&0xFFFFFFFF)|(~C1&state_F6);
    }
    // Evaluate CONE2 and flop F4:
    if (cycle>=3 && cycle<=8) {
        C2 = F1Q_delay2&C1_delay1; // uses pipelined values
        state_F4 = (C2&0xFFFFFFFF)|(~C2&state_F4);
    }
    // Model pipelines for C1 and F1Q:
    C1_delay1 = C1;
    F1Q_delay2 = F1Q_delay1;
    F1Q_delay1 = F1Q;
} // end for cycle
// Finally, evaluate flop F3 and CONE3 after the preset //
path has settled:
state_F3 =
(F1Q&0xFFFFFFFF)|(~F1Q&state_F3);
evaluate_CONE3( );
```

It should be noted that modeling of the pipeline and other path-dependent issues in this example have some of the same issues as the modeling of combinational loops described in detail above. For example, path lengths are not available until after the emulator has executed the FPGA place and route and scheduler functions of the emulation compilation.

Typically, asynchronous presets and clears within loops will not be much more problematic to model than asynchronous presets and clears by themselves, and loops by themselves. Both require an awareness of path lengths, modeling of pipeline delays within the loop, order of evaluation, and multiple iterations to cover paths through the loops and preset/clear paths.

With various examples of the invention, force, set and invert are run-time operations that may be invoked by the user when the emulator is stopped. The force operation coerces a state element output to a 0 or 1 for the remainder of the emulation (until the design is re-loaded) or until overridden explicitly by the user. The set operation coerces a state element output to a 0 or 1 until the state element is next updated during the emulation. The invert operation inverts a state element output for the remainder of the emulation (until the design is re-loaded) or until overridden explicitly by the user. These features may be implemented, for example, by re-writing the appropriate value in a look-up table (LUT) and/or flop value in a CPB while the emulator is stopped. Potentially this allows changing of any logic in the design.

The force/set/invert operations can be applied as a post-processing step to the state array after state update. This relies on the assumption that force/set/invert modifications are relatively few in number. They may occur for a fraction of the time that is simulated by the software state replay tool 301, so the post-processing may apply to a subset (including 0) of the time slices of the 32-bit-parallel simulation. The algorithm for this process may be expressed as follows:

current_cycle is maintained by the software state model and kernel

```
// elt identifies a state by index into the states array
// time identifies the time range for the mod:
//      this would be 1 time point for a set (transient)
//      potentially a range of time points for a force
// type indicates the type of mod: force, set, or invert
// value indicates 0 or 1 for force or set
while (elt,time,type,value = info for next modified state) do
    // this mask will indicate the bits to which the mod
    // may apply . . . this is conceivably 0 if the time range
    // for the force falls between current time slices
    mask = get mask for (current_cycle,time)
    if type is force or set: if value is 0:
            states[elt] |= ~mask // force mask bits to 0
        else
            states[elt] |= mask // force mask bits to 1
    else if type is invert:
            states[elt] ^= mask // invert mask bits
done
```

Various examples of the invention may alternately or additionally employ the force/set/invert operations in combinational logic (i.e., not associated with output of a state element). With these implementations, the software state replay tool 301 may create combinational logic evaluation engine on demand, based on the specific time and nature of the force/set/invert.

With various examples of the invention, a software state replay model produced as a result of an incremental software compile will be identical to one produced as a result of a full compile. Accordingly, the incremental compile must correctly generate a correct set of new software state replay models and integrate these with any previous set of models so that a complete set is available for creating visibility data.

Model Creation

With various examples of the invention, the model creation module 303 creates the software state replay models 307 during the synthesis operation of the emulation control system after all logic transformations and partitioning, but before the determination of the top-level interconnects. At this point in the synthesis compilation, the netlist for each FPGA is fixed, but the assignment of that netlist to a particular FPGA in the system is not yet fixed.

Code emitted for the software state replay model is separated into combinational logic computation code and state update code. The combinational logic computation code computes net values driven by combinational primitives throughout the netlist, in an order consistent with the netlist topology and simulated clock edges. The state update code updates the state of flip flops (propagates state to Q output, D input to state) on simulated clock edges. For state initialization, this code accepts initial data values for flop states and the Q outputs of flops. With constant initialization, some nets in the design are assigned constant values.

The model also is created to take into account input assignment, and to perform bit swapping. With regard to the input assignment, some nets in the design represent primary inputs of the FPGA and need to be assigned every cycle. The bit swap process may be executed, for example, every 32 cycles, so as to convert between the 32-bit-time-parallel bit ordering and a time-sequential bit ordering required by waveform viewing. This is essentially a reflection along the diagonal of a 32×32 unsigned int array. With some implementations, the bit swap operation requires 32 state replay cycles, requiring that the minimum interval between state captures should be 32.

The model may be created using any desired programming language, such as C code. For example, the model may be created using C code output in the form:

```
net[x] = net[y] <OP> net[z];
    <OP> is a binary logical
operator OR:
net[x] = ~ net[y];
```

It should be noted, however, that for some implementations of the invention, the use of the assembler programming language would allow pipeline optimizations to be performed, i.e., separating loads/stores with computational instructions to optimize the use of the data pipeline. Assembler would also yield a faster compilation time than some other programming languages.

With various examples of the invention, the emitted code might e.g., an array of unsigned int for all nets in the FPGA. It should be noted, however, that not all nets would be required to be stored in memory; only those that are re-used (i.e., have fan-out greater than 1) would need to be stored. The emitted code would also typically include an array of state for all flops, a 32×{# of state elements} array of state, used in the bit swap operation, counters for bit swap algorithm, and global integers for number of state elements and number of inputs.

In order to be more CPU cache-efficient, state updates may be emitted in net order, i.e., order of flop output net in the global net array. Also, a second pass could be performed for register allocation in creating combinational code. That is, a second pass could be used to optimize register allocation in code generated for combinational computation. A linear scan algorithm could then assign nets to registers based upon the number of uses in some lookahead window. A heuristic would resolve cases (which would almost always occur) in which more registers are needed than are available.

Conclusion

Although certain devices and methods have been described above in terms of the illustrative embodiments, the person of ordinary skill in the art will recognize that other embodiments, examples, substitutions, modification and alterations are possible. It is intended that the following claims cover such other embodiments, examples, substitutions, modifications and alterations within the spirit and scope of the claims.

What is claimed is:

1. A method of analyzing a partition of a circuit design, comprising:
    determining a predetermined partition of a circuit design being emulated;
    sampling an emulator to obtain one or more input values provided at a first time to the predetermined partition of the circuit design being emulated;
    sampling the emulator to obtain one or more first state values produced by the circuit design partition at the first time;
    using the obtained one or more input values and the one or more first state values to execute a software model that describes the operation of the circuit design partition, so as to calculate one or more second state values produced by the circuit design partition at a second time; and
    registering the one or more second state values in a tangible medium.

2. The method recited in claim 1, further comprising:
    sampling the emulator obtain each input value provided at the second time to the circuit design partition being emulated; and
    using each input value provided to the circuit design partition at the second time and the calculated one or more second state values to execute the software model, so as to calculate one or more third state values produced by the circuit design partition at a third time.

3. The method recited in claim 1, wherein
    the circuit design is being emulated by a plurality of configurable logic devices; and
    the circuit design partition is a portion of the circuit design being emulated by a single one of the plurality of configurable logic devices.

4. The method recited in claim 3, wherein the configurable logic devices are field programmable gate arrays.

5. The method recited in claim 1, further comprising:
    receiving synthesis information describing the circuit design partition from the emulator; and
    creating the software model from the synthesis information.

6. The method recited in claim 1, wherein
    the circuit design partition includes a plurality of time domains; and
    the software model includes a portion describing the operation of each time domain.

7. The method recited in claim 6, further comprising:
    sampling an emulator to obtain
    one or more cross-domain input values provided to the circuit design partition at one or more times prior to the first time, and
    a time of arrival of each sampled cross-domain input; and
    using the obtained one or more input values, the one or more first state values, and the one or more cross-domain input values and the time of arrival of each sampled cross-domain input to execute a software model that describes the operation of the circuit design partition, so as to calculate one or more second state values produced by the circuit design partition at a second time.

8. The method recited in claim 1, further comprising:
providing each obtained input value and the one or more first state values to a remote computing resource for executing the software model; and
receiving the calculated one or more second state values from the remote computing resource.

9. The method recited in claim 1, wherein registering the one or more second state values in the tangible medium includes rendering the one or more second state values on a display.

10. The method recited in claim 1, wherein registering the one or more second state values in the tangible medium includes storing the one or more second state values in a memory medium.

11. A computer readable storage medium having computer-executable instructions which when executed on a computing device perform a method of analyzing a partition of a circuit design, comprising:
determining a predetermined partition of a circuit design being emulated;
sampling an emulator to obtain one or more input values provided at a first time to the predetermined partition of the circuit design being emulated;
sampling the emulator to obtain one or more first state values produced by the circuit design partition at the first time;
using the obtained one or more input values and the one or more first state values to execute a software model that describes the operation of the circuit design partition, so as to calculate one or more second state values produced by the circuit design partition at a second time; and
registering the one or more second state values in a tangible medium.

12. A method of analyzing a circuit design partition, comprising:
determining a predetermined first partition of a circuit design;
sampling an emulator emulating the predetermined partition of the circuit design to obtain:
each cycle of a first clock signal being provided to the emulated circuit design partition during a defined analysis period,
each input value provided to the emulated circuit design partition at every cycle during the defined analysis period, and
one or more first state values produced by the emulated circuit design partition at specified state value sample times over the defined analysis period;
using the obtained input values, the first clock signals and one or more sampled state values to execute a first software model that describes the operation of the circuit design partition, so as to calculate state values produced by the circuit design partition during intervals between the specified state value sample times over the defined analysis period; and
registering at least the calculated state values in a tangible medium.

13. The method recited in claim 12, wherein
the circuit design is being emulated by a plurality of configurable logic devices; and
the circuit design partition is a portion of the circuit design being emulated by a single one of the plurality of configurable logic devices.

14. The method recited in claim 13, wherein the configurable logic devices are field programmable gate arrays.

15. The method recited in claim 12, further comprising:
receiving synthesis information describing the circuit design partition from the emulator; and
creating the first software model from the synthesis information.

16. The method recited in claim 12, wherein
the circuit design partition includes a plurality of time domains; and
the first software model includes a portion describing the operation of each time domain.

17. The method recited in claim 12, wherein registering the one or more calculated state values in the tangible medium includes rendering the one or more calculated state values on a display.

18. The method recited in claim 12, wherein registering the one or more calculated state values in the tangible medium includes storing the one or more calculated state values in a memory medium.

19. The method recited in claim 12, further comprising:
sampling the emulator emulating a second partition of the circuit design to obtain:
each cycle of a second clock signal being provided to the emulated second circuit design partition during the defined analysis period,
each input value provided to the emulated second circuit design partition at every cycle of the second clock period during the defined analysis period, and
one or more second state values produced by the emulated second circuit design partition at second specified state value sample times over the defined analysis period;
using the obtained input values provided to the emulated second circuit design partition, the cycles of the second clock signal and the one or more sampled second state values to execute a second software model that describes the operation of the second circuit design partition, so as to calculate second state values produced by the second circuit design partition during intervals between the second specified state value sample times over the defined analysis period; and
registering at least the calculated second state values in a tangible medium.

20. The method recited in claim 19, further comprising:
providing each cycle of the first clock signal, each input value provided to the emulated first circuit design partition at every cycle of the first clock signal, and the sampled first state values to a first remote computing resource for executing the first software model;
receiving the calculated first state values from the first remote computing resource;
providing each cycle of the second clock signal, each input value provided to the emulated second circuit design partition at every cycle of the second clock signal, and the sampled second state values to a second remote computing resource for executing the second software model; and
receiving the calculated second state values from the second remote computing resource.

21. The method recited in claim 20, wherein the first remote processing computer resource executes the first software model in parallel with the second remote processing computer resource executing the second software model.

22. A computer readable storage medium having computer-executable instructions that, when executed on a computing device, perform a method of analyzing a circuit design partition comprising:

determining a predetermined partition of a circuit design;
sampling an emulator emulating the predetermined partition of the circuit design to obtain:
each cycle of a clock signal being provided to the emulated circuit design partition during a defined analysis period;
each input value provided to the emulated circuit design partition at every cycle during the defined analysis period; and
one or more state values produced by the emulated circuit design partition at specified state value sample times over the defined analysis period;

using the obtained input values, clock signals and one or more sampled state values to execute a software model that describes the operation of the circuit design partition, so as to calculate state values produced by the circuit design partition during intervals between the specified state value sample times over the defined analysis period; and
registering at least the calculated state values in a tangible medium.

\* \* \* \* \*